United States Patent
Kwon

(10) Patent No.: US 10,025,354 B2
(45) Date of Patent: Jul. 17, 2018

(54) SYSTEM MODULE AND MOBILE COMPUTING DEVICE INCLUDING THE SAME

(71) Applicant: SAMSUNG ELECTRONICS CO., LTD., Suwon-si, Gyeonggi-do (KR)

(72) Inventor: Heung Kyu Kwon, Seongnam-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/270,918

(22) Filed: Sep. 20, 2016

(65) Prior Publication Data
US 2017/0185107 A1 Jun. 29, 2017

(30) Foreign Application Priority Data
Dec. 23, 2015 (KR) .................. 10-2015-0184700

(51) Int. Cl.
*H05K 7/10* (2006.01)
*G06F 1/16* (2006.01)

(52) U.S. Cl.
CPC .......... *G06F 1/1635* (2013.01); *G06F 1/1658* (2013.01); *H01L 2224/16227* (2013.01); *H01L 2924/15192* (2013.01); *H01L 2924/1815* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01)

(58) Field of Classification Search
USPC ......................... 361/761, 760, 748
See application file for complete search history.

(56) References Cited

U.S. PATENT DOCUMENTS

| | | | |
|---|---|---|---|
| 8,716,655 B2 | 5/2014 | Chi et al. | |
| 8,890,628 B2 | 11/2014 | Nair et al. | |
| 8,891,246 B2 | 11/2014 | Guzek et al. | |
| 9,728,481 B2* | 8/2017 | Yee | H01L 23/36 |
| 2006/0209515 A1 | 9/2006 | Moshayedi | |
| 2010/0059853 A1* | 3/2010 | Lin | H01L 27/016 257/528 |
| 2010/0061056 A1 | 3/2010 | Searls et al. | |
| 2011/0317381 A1* | 12/2011 | Kim | H01L 25/0657 361/761 |
| 2013/0058067 A1 | 3/2013 | Yee et al. | |
| 2013/0127054 A1 | 5/2013 | Muthukumar et al. | |
| 2013/0181359 A1 | 7/2013 | Wu | |
| 2014/0133105 A1 | 5/2014 | Yee et al. | |
| 2015/0097277 A1* | 4/2015 | Chen | H01L 23/3135 257/668 |
| 2015/0194362 A1 | 7/2015 | Otremba et al. | |

* cited by examiner

*Primary Examiner* — Andargie M Aychillhum
(74) *Attorney, Agent, or Firm* — F. Chau & Associates, LLC

(57) ABSTRACT

A system module includes a printed circuit board (PCB), a first semiconductor chip embedded in the PCB, a semiconductor package connected to the PCB through a plurality of stack balls, and a second semiconductor chip disposed on a surface of the PCB in a space between the PCB and the semiconductor package.

20 Claims, 18 Drawing Sheets

SYSTEM MODULE AND MOBILE COMPUTING DEVICE INCLUDING THE SAME

CROSS-REFERENCE TO RELATED APPLICATIONS

This application claims priority under 35 U.S.C. § 119 to Korean Patent Application No. 10-2015-0184700 filed on Dec. 23, 2015, the disclosure of which is hereby incorporated by reference in its entirety.

TECHNICAL FIELD

Exemplary embodiments of the present inventive concept relate to a system module, and more particularly, to a system module including a system board having one of a processor chip and a power management integrated circuit (PMIC) embedded therein, and a mobile computing device including the same.

DISCUSSION OF THE RELATED ART

Semiconductor packaging is used for physically protecting a semiconductor chip, mutual wiring, and a power supply. For example, semiconductor packaging may protect a semiconductor chip from various external factors such as, for example, high temperature, high humidity, chemicals, vibration, and shocks.

As wearable electronic devices become more common, an embedded package on package (ePOP) has been developed. The ePOP is a semiconductor package that typically includes a dynamic random access memory (DRAM) chip, a NAND flash memory chip, and a controller chip, and that is suitable for a small-sized wearable electronic device. The ePOP may be stacked on an application processor. Decreasing the size of the ePOP allows for a decrease in the size of a wearable electronic device utilizing the ePOP.

SUMMARY

According to an exemplary embodiment of the present inventive concept, a system module includes a printed circuit board (PCB), a first semiconductor chip embedded in the PCB, a semiconductor package connected to the PCB through a plurality of stack balls, and a second semiconductor chip disposed on a surface of the PCB in a space between the PCB and the semiconductor package.

According to an exemplary embodiment of the present inventive concept, a system module includes a printed circuit board (PCB), a processor chip embedded in the PCB, and a semiconductor package connected to the PCB through a plurality of stack balls and disposed at a position facing the processor chip.

According to an exemplary embodiment of the inventive concept, a mobile computing device includes a system module, a peripheral device connected to the system module, and a battery connected to the system module. The system module includes a printed circuit board (PCB), a first semiconductor chip embedded in the PCB, a semiconductor package connected to the PCB through a plurality of stack balls, and a second semiconductor chip disposed on a surface of the PCB in a space between the PCB and the semiconductor package. The first semiconductor chip is one of a power management integrated circuit (PMIC) and a processor chip, and the second semiconductor chip is the other one of the PMIC and the processor chip.

According to an exemplary embodiment of the present inventive concept, a system module includes a printed circuit board (PCB), a first semiconductor chip completely embedded within the PCB between an upper surface of the PCB and a lower surface of the PCB, a semiconductor package disposed on the upper surface of the PCB and connected to the PCB through a plurality of stack balls, and a second semiconductor chip disposed on the upper surface of the PCB below the semiconductor package. The semiconductor package overlaps the first and second semiconductor chips.

BRIEF DESCRIPTION OF THE DRAWINGS

The above and other features of the present inventive concept will become apparent by describing in detail exemplary embodiments thereof with reference to the accompanying drawings, in which.

DETAILED DESCRIPTION OF THE EXEMPLARY EMBODIMENTS

Figure 1:
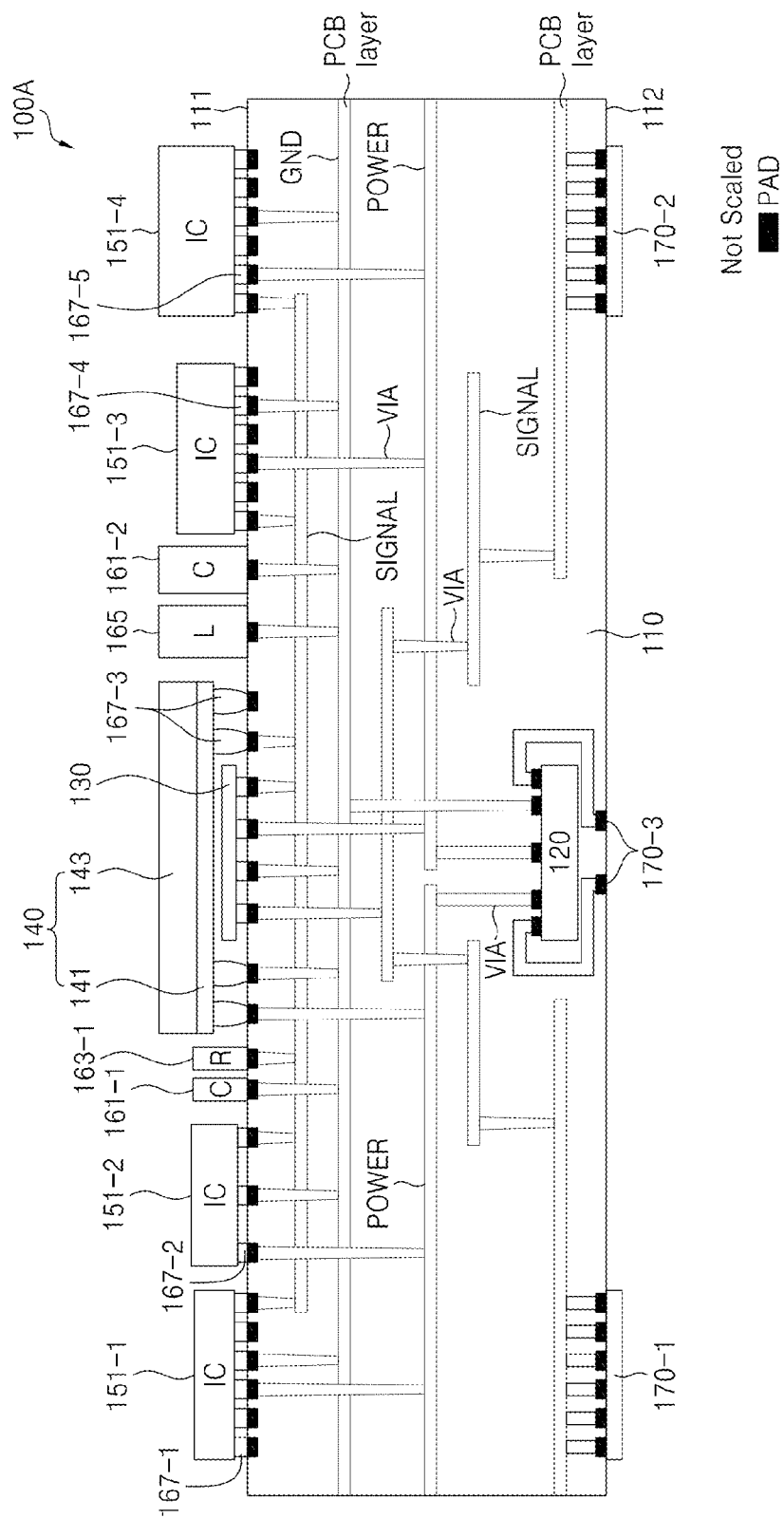
FIG. 1 is a cross-sectional view of a system module including a first printed circuit board (PCB) having an embedded first semiconductor chip according to exemplary embodiments of the present inventive concept.

Exemplary embodiments of the present inventive concept will be described more fully hereinafter with reference to the accompanying drawings. In the drawings, the size and relative sizes of components, layers and regions may be exaggerated for clarity. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It will be further understood that when a component is referred to as being 'on', 'connected to', 'coupled to', or 'adjacent to' another component, it can be directly on, connected to, coupled to, or adjacent to the other component, or intervening components may also be present. It will also be understood that when a component is referred to as being 'between' two components, it can be the only component between the two components, or one or more intervening components may also be present.

Referring to FIGS. 1 to 7 and 17, a first semiconductor chip 120 (e.g., a power management integrated circuit (IC)) (also referred to generally as a chip 120) is embedded in a first printed circuit board (PCB) 110 of each of system modules 100A, 100B, 100C, 100D, 100E, and 100F. As a result, according to exemplary embodiments of the inventive concept, the thickness, size, power integrity (PI), and signal integrity (SI) of each of the system modules 100A, 100B, 100C, 100D, 100E, and 100F may be improved. The PCB 110 is formed of a non-conductive material. The PCB 110 mechanically supports and electrically connects electronic components mounted thereon using conductive lines, pads, etc., as described further below. The system modules 100A, 100B, 100C, 100D, 100E, and 100F may also be referred to herein as semiconductor devices.

As shown in FIGS. 8 to 15 and 18, a second semiconductor chip 130 (e.g., a processor IC) (also referred to generally as a chip 130), is embedded in a first PCB 110B or 110C of each of system modules 100G, 100H, 100I, 100J, 100K, 100L, 100M, and 100N. As a result, according to exemplary embodiments of the inventive concept, the thickness, size, power integrity (PI), and signal integrity (SI) of each of the system modules 100G, 100H, 100I, 100J, 100K, 100L, 100M, and 100N may be improved. According to exemplary embodiments of the inventive concept described herein, the first semiconductor chip may refer to a semiconductor chip embedded in the first PCB 110, 110B, or 110C, and the second semiconductor chip may refer to a semiconductor chip that is not embedded in the first PCB 110, 110B, or 110C.

FIG. 1 is a cross-sectional view of a system module including a first PCB having an embedded first semiconductor chip according to exemplary embodiments of the present inventive concept. Referring to FIG. 1, a system module 100A may include the first PCB 110, the first semiconductor chip 120, the second semiconductor chip 130, a semiconductor package 140, a plurality of ICs 151-1, 151-2, 151-3, and 151-4, passive elements 161-1, 161-2, 163-1, and 165, and connection terminals 170-1 and 170-2.

The first PCB 110 may include a plurality of vias VIA, a plurality of pads PAD, a ground line GND, a voltage supply line POWER, and a signal transmission line SIGNAL for transmitting a signal embedded therein. The first PCB 110 may refer to, for example, a system board.

The ground line GND shown in FIG. 1 may collectively or conceptually represent one or more ground lines, the power supply line POWER may collectively or conceptually represent one or more voltage supply lines, and the signal transmission line SIGNAL may collectively or conceptually represent one or more signal transmission lines.

PCB layers, vias VIA, pads PAD, a ground line GND for supplying a ground voltage, a voltage supply line POWER for supplying an operation voltage, and a signal transmission line SIGNAL in the first PCB 110, 110B, or 110C shown in FIGS. 1 to 15 are exemplary. Exemplary embodiments of the present inventive concept are not limited to the internal structure of the first PCB 110, 110B, or 110C shown in FIGS. 1 to 15. That is, although each of the PCB layers described herein may refer to a ground line GND, a voltage supply line POWER, or a signal transmission line SIGNAL, exemplary embodiments of the inventive concept are not limited thereto. In exemplary embodiments, the first semiconductor chip 120 may refer to a power management integrated circuit (PMIC), and the second semiconductor chip 130 may refer to a processor chip, as described further below. Thus, the terms first semiconductor chip 120 and PMIC 120, and the terms second semiconductor chip 130 and processor chip 130, may be used interchangeably herein. The semiconductor chip 130/processor chip 130 may also be referred to as a central processing unit (CPU) 130 or a processor 130.

The PMIC 120 embedded in the first PCB 110 may supply corresponding operation voltages (e.g., an operation voltage and a ground voltage) to each of the components 130, 140, 151-1, 151-2, 151-3, and 151-4 through the vias VIA, the pads PAD, the ground line GND, and the voltage supply line POWER, which are disposed in the first PCB 110.

In addition, the PMIC 120 may supply a ground voltage and/or an operation voltage to at least one of the passive elements 161-1, 161-2, 163-1, and 165 through the vias VIA, the pads PAD, the ground line GND, and the voltage supply line POWER disposed in the first PCB 110. Referring to FIGS. 1 to 18, an operation voltage output from the PMIC 120 may be supplied to the processor chip 130 through a passive element, and may also be supplied to the processor chip 130 without going through the passive element. The passive elements may include, for example, an inductor L, a capacitor C, and a resistor R.

The processor chip 130 may be disposed/mounted in a position facing the PMIC 120 embedded in the first PCB 110 in a substantially vertical direction on or above a first surface 111 of the first PCB 110. Thus, the processor chip 130 may be disposed on/mounted to an external surface (e.g., the first surface 111) of the first PCB 110 in a space between the first PCB 110 and the semiconductor package 140. The first surface 111 may also be referred to as a top surface 111 or a top side 111 of the first PCB 110. The semiconductor package 140 is disposed on/mounted to an external surface (e.g., the top surface 111) of the first PCB 110.

The processor chip 130 may control an operation of each of the components 120, 140, 151-1, 151-2, 151-3, and 151-4, or transmit or receive signals to or from each of the components 120, 140, 151-1, 151-2, 151-3, and 151-4 through the vias VIA, the pads PAD, and the signal transmission line SIGNAL. According to exemplary embodiments, the processor chip 130 may transmit or receive signals to or from each of the components 151-1, 151-2, 151-3, and 151-4 through at least one of the passive elements (e.g., the inductor L, the capacitor C, and the resistor R).

Each of the components 120, 130, 140, 151-1, 151-2, 151-3, and 151-4 may transmit or receive signals to or from one another through the vias VIA, the pads PAD, and the signal transmission line SIGNAL disposed in the first PCB 110. According to exemplary embodiments, one of the components 120, 130, 140, 151-1, 151-2, 151-3, and 151-4 may transmit or receive signals to or from another one of the components 120, 130, 140, 151-1, 151-2, 151-3, and 151-4 through at least one of the passive elements (e.g., the inductor L, the capacitor C, and the resistor R).

FIG. 1 shows an exemplary embodiment in which each of capacitors 161-1 and 161-2 is connected to the ground line GND. However, exemplary embodiments of the inventive concept are not limited thereto. For example, in exemplary embodiments, one terminal of each of the capacitors 161-1 and 161-2 may be connected to one of a via VIA, a pad PAD, a ground line GND, a voltage supply line POWER, and a signal transmission line SIGNAL, and the other terminal of each of the capacitors 161-1 and 161-2 may be connected to another one of the via VIA, the pad PAD, the ground line GND, the voltage supply line POWER, and the signal transmission line SIGNAL.

FIG. 1 shows an exemplary embodiment in which a resistor 163-1 is connected to the signal transmission line SIGNAL. However, exemplary embodiments of the inventive concept are not limited thereto. For example, in exemplary embodiments, one terminal of the resistor 163-1 may be connected to one of the via VIA, the pad PAD, the ground line GND, the voltage supply line POWER, and the signal transmission line SIGNAL, and the other terminal of the resistor 163-1 may be connected to another one of the via VIA, the pad PAD, the ground line GND, the voltage supply line POWER, and the signal transmission line SIGNAL.

FIG. 1 shows an exemplary embodiment in which the inductor 165 is connected to the ground line GND. However, exemplary embodiments of the inventive concept are not limited thereto. For example, in exemplary embodiments, one terminal of the inductor 165 may be connected to one of the via VIA, the pad PAD, the ground line GND, the voltage supply line POWER, and the signal transmission line SIGNAL, and the other terminal of the inductor 165 may be connected to another one of the via VIA, the pad PAD, the ground line GND, the voltage supply line POWER, and the signal transmission line SIGNAL. For convenience of description, FIG. 1 shows an exemplary embodiment in which the passive elements 161-2 and 165 are disposed between the processor chip 130 and a third IC 151-3. However, exemplary embodiments of the inventive concept are not limited thereto. For example, in exemplary embodiments, at least one of the passive elements (e.g., the inductor L, the capacitor C, and the resistor R) may be disposed between two corresponding ICs. Here, the IC may refer to, for example, a chip, a die, or a semiconductor package. However, the IC is not limited thereto.

The first semiconductor chip 120 is embedded (e.g., completely embedded) in the first PCB 110. For example, the first semiconductor chip 120 may be disposed between the top surface 111 and a bottom surface 112 of the first PCB 110, such that the first semiconductor chip 120 is encapsulated within the first PCB 110. The first semiconductor chip 120 may be completely embedded within the first PCB 110 such that the first semiconductor chip 120 does not extend beyond any surfaces (e.g., surfaces 111 and 112) of the first PCB 110. For example, in exemplary embodiments, the first semiconductor chip 120 is completely surrounded by the first PCB 110 and is not visible when viewing the external surfaces of the first PCB 110. As a result of embedding the first semiconductor chip 120 within the first PCB 110, the height/thickness of the system module 100A may be reduced. The thickness of the PMIC 120 may be smaller than the thickness of the first PCB 110. However, exemplary embodiments of the inventive concept are not limited thereto.

The second semiconductor chip 130 may be attached/connected to pads formed/disposed on the first surface 111 of the first PCB 110 through, for example, metal balls. For example, the second semiconductor chip 130 may have a flip chip structure and may be attached to the pads formed on the first surface 111 of the first PCB 110 through the metal balls. Here, metal balls may refer to, for example, solder balls, solder bumps, or micro bumps. Moreover, the metal balls may refer to various types of electrical conductors which can be connected to the first PCB 110 or pads of each of the components 130, 140, 151-1, 151-2, 151-3, 151-4, 161-1, 161-2, 163-1, and/or 165.

The processor chip 130 may refer to an application processor, a chip, a system-on-chip (SoC), or an application processor chip which can serve as a modem (referred to as "ModAP®"). Moreover, the processor chip may refer to a main control unit. The ModAP® may refer to an application processor which embeds a wireless communication chip such as, for example, a third generation (3G) mobile communication chip, a fourth generation (4G) mobile communication chip, or a long term evolution (LTE™) mobile communication chip. However, the ModAP® is not limited thereto.

The PMIC 120 is embedded in the first PCB 110. As a result, the thickness/height of the system module 100A is reduced compared to a conventional embedded package on package (ePOP). For example, in an exemplary embodiment, the ModAP® is embedded in the first PCB 110. As a result, a constraint of a ball map configuration and a design constraint of the ePOP may be removed or reduced. Moreover, according to exemplary embodiments of the inventive concept, a size or a thickness of an embedded multichip package (eMCP) may be reduced, a size or a thickness of a system module including the eMCP may be reduced, and a thickness/height of the system module may be also reduced.

Since, according to exemplary embodiments, the first semiconductor chip 120 and the second semiconductor chip 130 are disposed at a position facing each other (e.g., since the first semiconductor chip 120 and the second semiconductor chip 130 are aligned with each other), a length of each of power lines between the first semiconductor chip 120 and the second semiconductor chip 130 may be reduced. Accordingly, power loss may be reduced and power integrity may be increased.

The semiconductor package 140 may include a second PCB 141 and a semiconductor device 143 connected to the second PCB 141. For example, in an exemplary embodiment, the semiconductor package 140 connected to the second semiconductor chip 130 may be disposed over the second semiconductor chip 130, and may be disposed/mounted in a POP form with the first PCB 110. The semiconductor package 140 may be connected to the first PCB 110 through a plurality of stack balls, and may be disposed at a position facing the first semiconductor chip 120. For example, the semiconductor package 140 may be aligned with the first semiconductor chip 120 and the second semiconductor chip 130 such that the semiconductor package 140 overlaps the first semiconductor chip 120 and the second semiconductor chip 130 when viewed in a cross-sectional view, as shown in FIG. 1. Thus, the semiconductor package 140 may be described as being disposed over the first semiconductor chip 120 and the second semiconductor chip 130. In addition, in exemplary embodiments, the respective centers of the semiconductor package 140, the first semiconductor chip 120, and the third semiconductor chip 130 may be substantially aligned with one another (e.g., the respective centers may be exactly aligned with one another, or may be closely aligned with one another in such a manner that is indistinguishable from being exactly aligned with one another).

Figure 2:
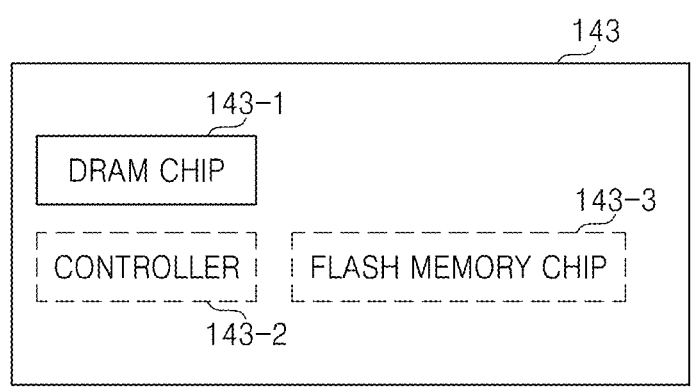
FIG. 2 shows the internal structure of a semiconductor device shown in FIG. 1 according to an exemplary embodiment of the present inventive concept.

FIG. 2 shows the internal structure of a semiconductor device shown in FIG. 1 according to an exemplary embodiment of the inventive concept. Referring to FIGS. 1 and 2, the second semiconductor device 143 may include volatile memory such as at least one DRAM chip 143-1 according to exemplary embodiments of the inventive concept. According to exemplary embodiments, the semiconductor device 143 may include all or some of a DRAM chip 143-1, a controller 143-2, and a non-volatile memory chip such as a flash memory chip 143-3. The flash memory chip 143-3 may be, for example, a NAND-type flash memory chip. The controller 143-2 may control an operation of the flash memory chip 143-3 under the control of the processor chip 130. That is, according to exemplary embodiments, the processor chip 130 may control an operation of the DRAM chip 143-1. An operation voltage of each of the DRAM chip 143-1, the controller 143-2, and the flash memory chip 143-3 may be supplied by the PMIC 120.

The semiconductor package 140 may be disposed over the second semiconductor chip 130 through metal balls (also referred to as stack balls 167-3), and may be attached/connected to pads formed on the first surface 111 of the first PCB 110 through metal balls 167-3.

The semiconductor package 140 may be embodied in an eMCP or an uMCP. The eMCP may refer to, for example, a multichip package including the DRAM chip 143-1, the controller 143-2, and the NAND-type flash memory chip 143-3, and the NAND-type flash memory chip 143-3 may support an embedded multimedia card (eMMC) protocol. The uMCP may refer to, for example, a multichip package including the DRAM chip 143-1, the controller 143-2, and the NAND-type flash memory chip 143-3, and the NAND-type flash memory chip 143-3 may support a universal flash storage (UFS) protocol.

Referring to FIG. 1, a first IC 151-1 may be attached to the pads formed on the first surface 111 of the first PCB 110 through metal balls 167-1, a second IC 151-2 may be attached to the pads formed on the first surface 111 of the first PCB 110 through metal balls 167-2, a third IC 151-3 may be attached to the pads formed on the first surface 111 of the first PCB through metal balls 167-4, and a fourth IC 151-4 may be attached to the pads formed on the first surface 111 of the first PCB 110 through metal balls 167-5. Each of the ICs 151-1, 151-2, 151-3, and 151-4 may be electrically connected to the first semiconductor chip 120 and/or the second semiconductor chip 130. One of the ICs 151-1, 151-2, 151-3, and 151-4 may be electrically connected to another one of the ICs 151-1, 151-2, 151-3, and 151-4.

According to exemplary embodiments, at least one of the pads connected to the metal balls 167-1, 167-2, 167-3, 167-4, or 167-5 corresponding to each of the components 151-1, 151-2, 140, 151-3, and 151-4 is connected to the first PCB 110, and may perform a function of transmitting at least one test signal when the processor chip 130 is tested, and a function of connecting each of the components 151-1, 151-2, 140, 151-3, and 151-4 to the first PCB 110 when each of the components 151-1, 151-2, 140, 151-3, and 151-4 is connected to the first PCB 110. According to exemplary embodiments, at least two of the pads disposed on the top surface 111 of the first PCB 110 that are connected to the first semiconductor chip 120 are used as test pads for transmitting test signals to the first semiconductor chip 120 during a testing operation of the first semiconductor chip 120. The testing operation of the first semiconductor chip 120 may be performed to determine whether the first semiconductor chip 120 is operating normally. In addition, the pads disposed on the top surface 111 of the first PCB 110 may also be used as connection pads for connecting, for example, the second semiconductor device 143 to the upper surface 111 of the first PCB 110.

According to exemplary embodiments, in addition to being used as a test pad during a testing operation, at least one of the pads connected to the metal balls 167-1, 167-2, 167-3, 167-4, or 167-5 may also be used as a connection pad during a connection operation. That is, some of the pads connected to the processor chip 130 may be used as test pads and also as surface-mount device (SMD) pads for directly mounting SMDs 140, 151-1 to 151-4, 161-1, 161-2, 163-1, and 165 on the first PCB 110.

Each of the passive elements 161-1, 161-2, 161-3, and 165 shown in FIG. 1 may be connected to corresponding pads positioned in the first PCB 110. In the exemplary embodiment shown in FIG. 1, each of the passive elements 161-1 and 161-2 represents a capacitor, the passive element 163-1 represents a resistor, and the passive element 165 represents an inductor. Although FIG. 1 illustrates that the passive elements 161-2 and 165 are disposed between the semiconductor package 140 and the third IC 151-3 in a substantially horizontal direction, exemplary embodiments of the inventive concept are not limited thereto. As shown in FIG. 1, in exemplary embodiments, the plurality of ICs 151-1, 151-2, 151-3, and 151-4 and the passive elements 161-1, 161-2, 163-1, and 165 may be disposed only on the first surface 111 of the first PCB 110. It is to be understood that the type of passive elements, the number of passive elements, and the location of passive elements is not limited to the configuration shown in FIG. 1.

First connectors 170-1 and second connectors 170-2 may be connected to pads disposed on a second surface 112 of the first PCB 110. The second surface 112 may also be referred to as a bottom/lower surface 112 or a bottom/lower side 112 of the first PCB 110. According to exemplary embodiments, the first connectors 170-1 and the second connector 170-2 may refer to pads themselves which are disposed on the second surface 112 of the first PCB 110. The first connectors 170-1 may be connected to a first peripheral device and the second connectors 170-2 may be connected to a second peripheral device. According to exemplary embodiments, each of the first connectors 170-1 and the second connectors 170-2 may be embodied as flexible film connectors or flexible printed circuit (FPC) connectors. However, the first connectors 170-1 and 170-2 are not limited thereto.

The first peripheral device or the second peripheral device may be, for example, a display, earphone(s), a USB port, a charger, etc. The pads formed/disposed on the second surface 112 of the first PCB 110 may be pads used, for example, for a testing operation, for a debugging operation, and/or for general-purpose input/output (GPIO). However, the pads are not limited thereto. In an exemplary embodiment, the pads used for a test may be Joint Test Action Group (JTAG) pads. Here, the pads may refer to pins.

Pads 170-3 disposed on the second surface 112 of the first PCB 110 may supply operation voltages to the PMIC 120. For example, the pads 170-3 may be connected to a battery. The pads 170-1, 170-2 and 170-3 may be flexible film connectors or flexible printed circuit (FPC) connectors.

Figure 3:
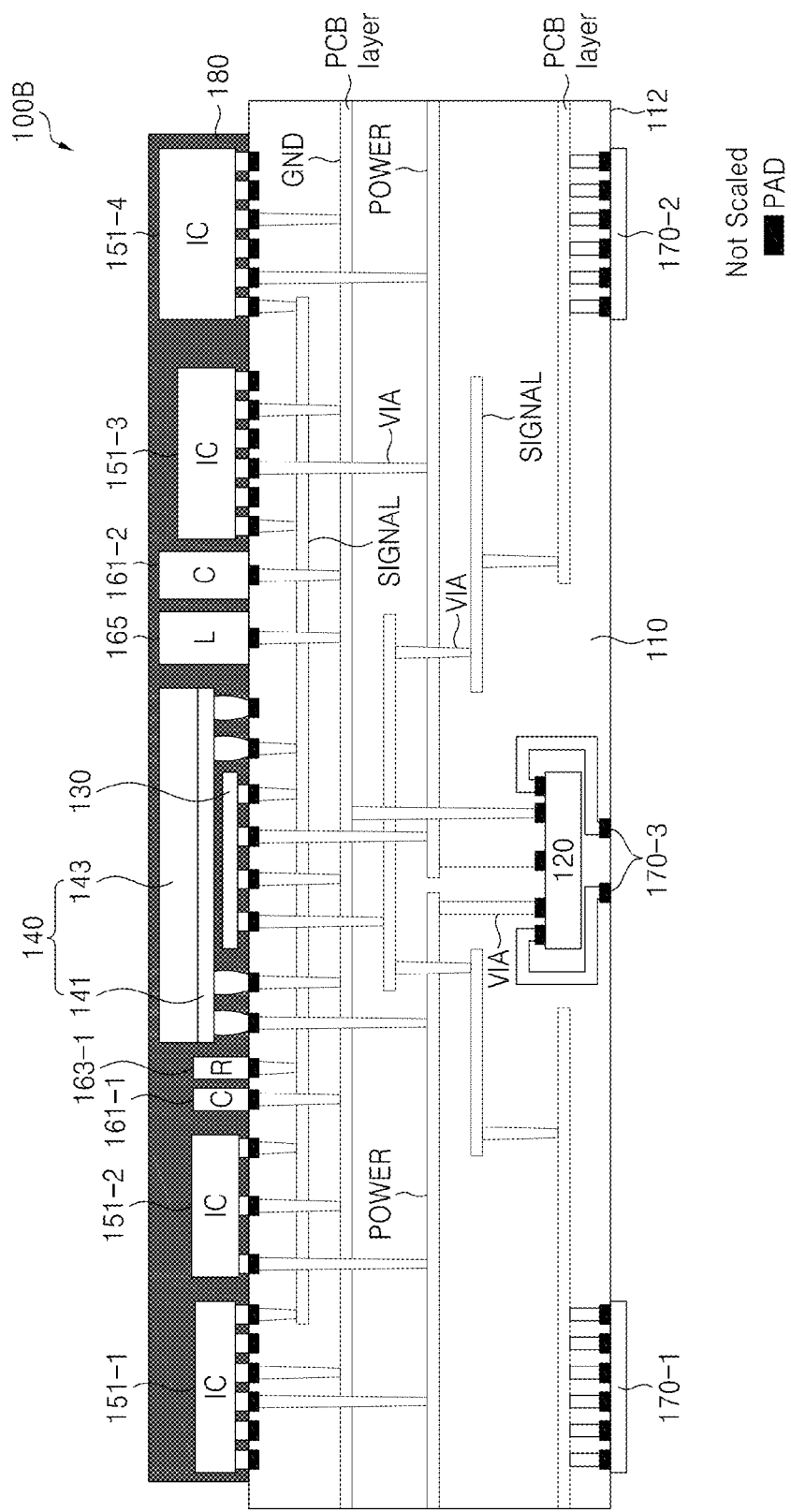
FIGS. 3 to 5 are cross-sectional views of system modules including the first PCB having an embedded first semiconductor chip according to exemplary embodiments of the present inventive concept.
Figure 4:
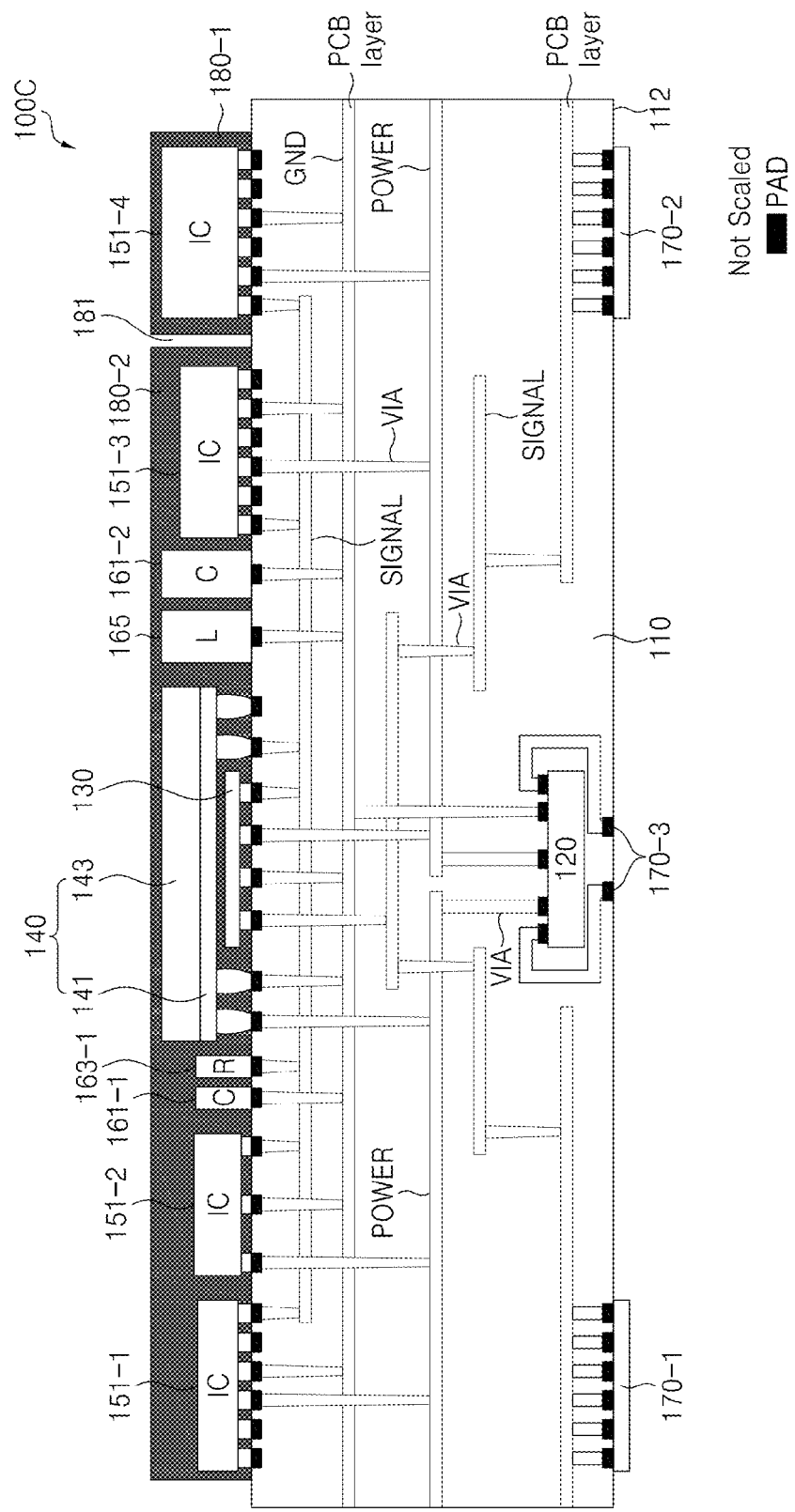
Figure 5:
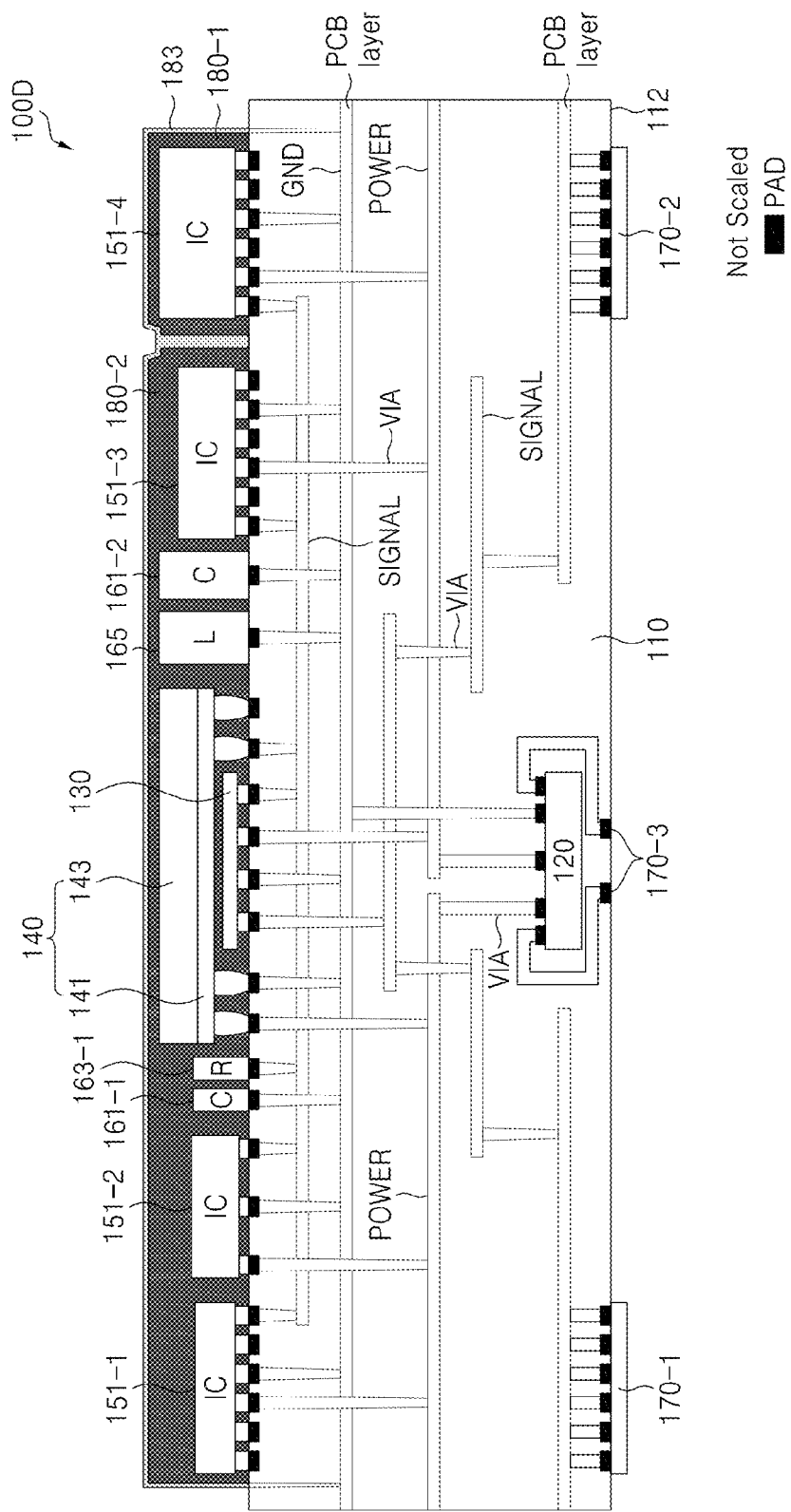

FIGS. 3 to 5 are cross-sectional views of system modules according to exemplary embodiments of the present inventive concept. Referring to FIG. 3, the system module 100B is conceptually the same as the system module 100A of FIG. 1, except that the system module 100B includes a protective material 180 formed on the first surface 110. Referring to FIGS. 1 and 3, the components 130, 141, 143, 151-1, 151-2, 151-3, 151-4, 161-1, 161-2, 163-1, and 165 attached to the first surface 111 of the first PCB 110, the metal balls 167-1, 167-2, 167-3, 167-4, and 167-5, and the pads disposed on the first surface 111 are encapsulated/molded by the protective material 180. The protective material 180 may be, for example, an epoxy molding compound (EMC). However, the protective material 180 is not limited thereto. The protective material 180 may refer to a molding material.

Referring to FIG. 4, the system module 100C is conceptually the same as the system module 100B of FIG. 3, except that the system module 100C includes a via 181 formed in the protective material 180. The via 181 may be, for example, a laser-drilled via 181. The protective material 180 may be divided into a first portion 180-1 and a second portion 180-2, as shown in FIG. 4, by the via 181, which may be formed by a laser drill.

Referring to FIGS. 4 and 5, a conductive electromagnetic interference (EMI) shielding material 183 may be formed on each of the first portion 180-1 of the protective material 180, the second portion 180-2 of the protective material 180, and the via 181. The via 181 may be filled (e.g., completely filled) with the conductive EMI shielding material 183. The conductive EMI shielding material 183 may be connected to a ground line GND embedded in the first PCB 110. Referring to FIGS. 4 and 5, the conductive EMI shielding material 183 filling the via 181 may perform a function of shielding EMI. For example, in an exemplary embodiment, the component 151-4 (e.g., a fourth IC) may be embodied as a radio frequency (RF) IC (or any other IC capable of causing EMI), and the conductive EMI shielding material 183 filling the via 181 may perform a function of shielding EMI occurring in a substantially horizontal direction between at least one of the components 120, 130, 140, 151-1, 151-2, 151-3, 161-1, 161-2, 163-1, and 165 attached to the first surface 111 and the component 151-4. As shown in FIG. 5, the first portion 180-1 of the protective material 180 and the second portion 180-2 of the protective material 180 may be separated from each other (e.g., completely separated from each other) by the conductive EMI shielding material 183 that fills the via 181.

Figure 6:
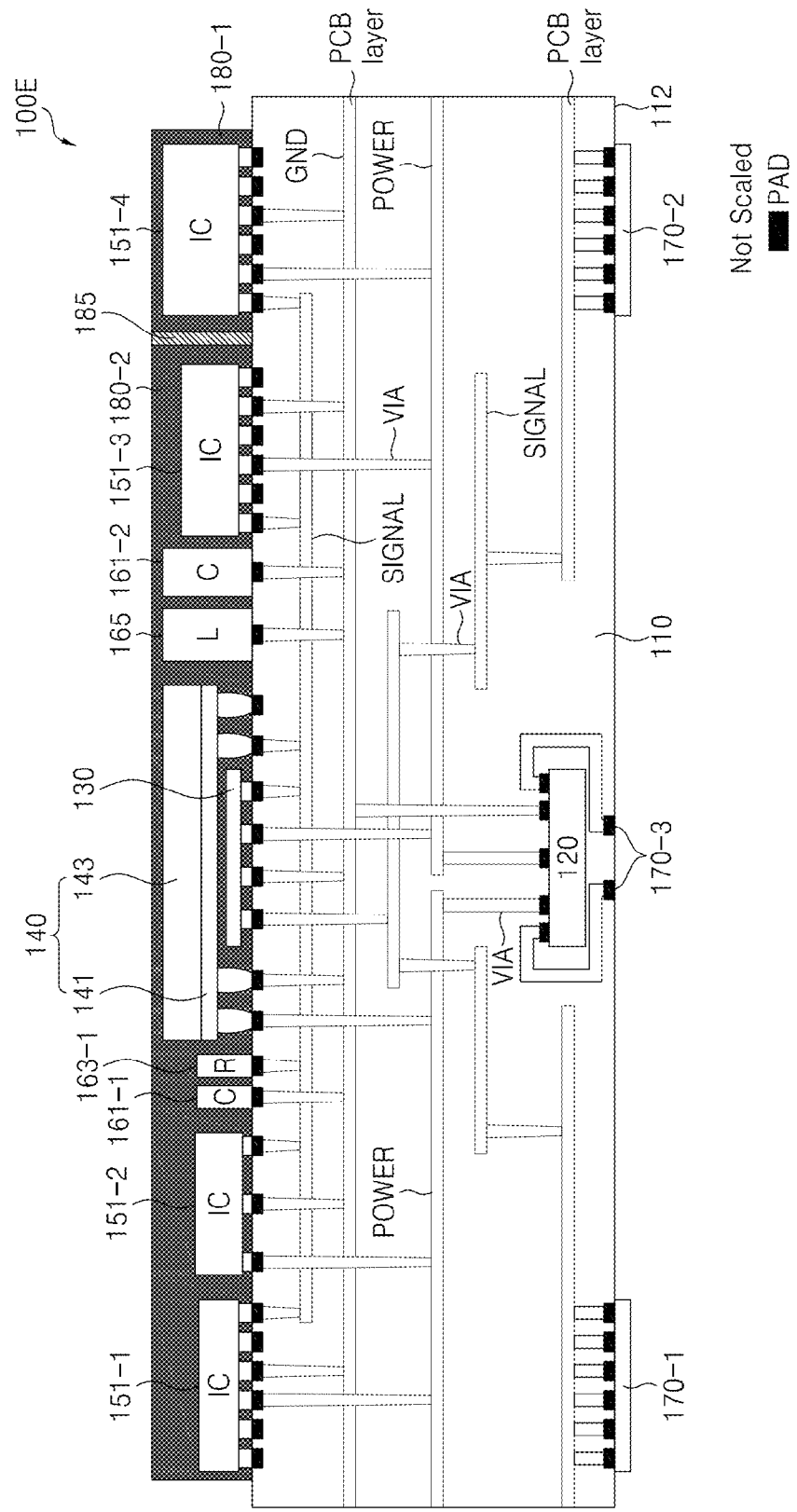
FIGS. 6 and 7 are cross-sectional views of the system modules including the first PCB having an embedded first semiconductor chip according to exemplary embodiments of the present inventive concept.
Figure 7:
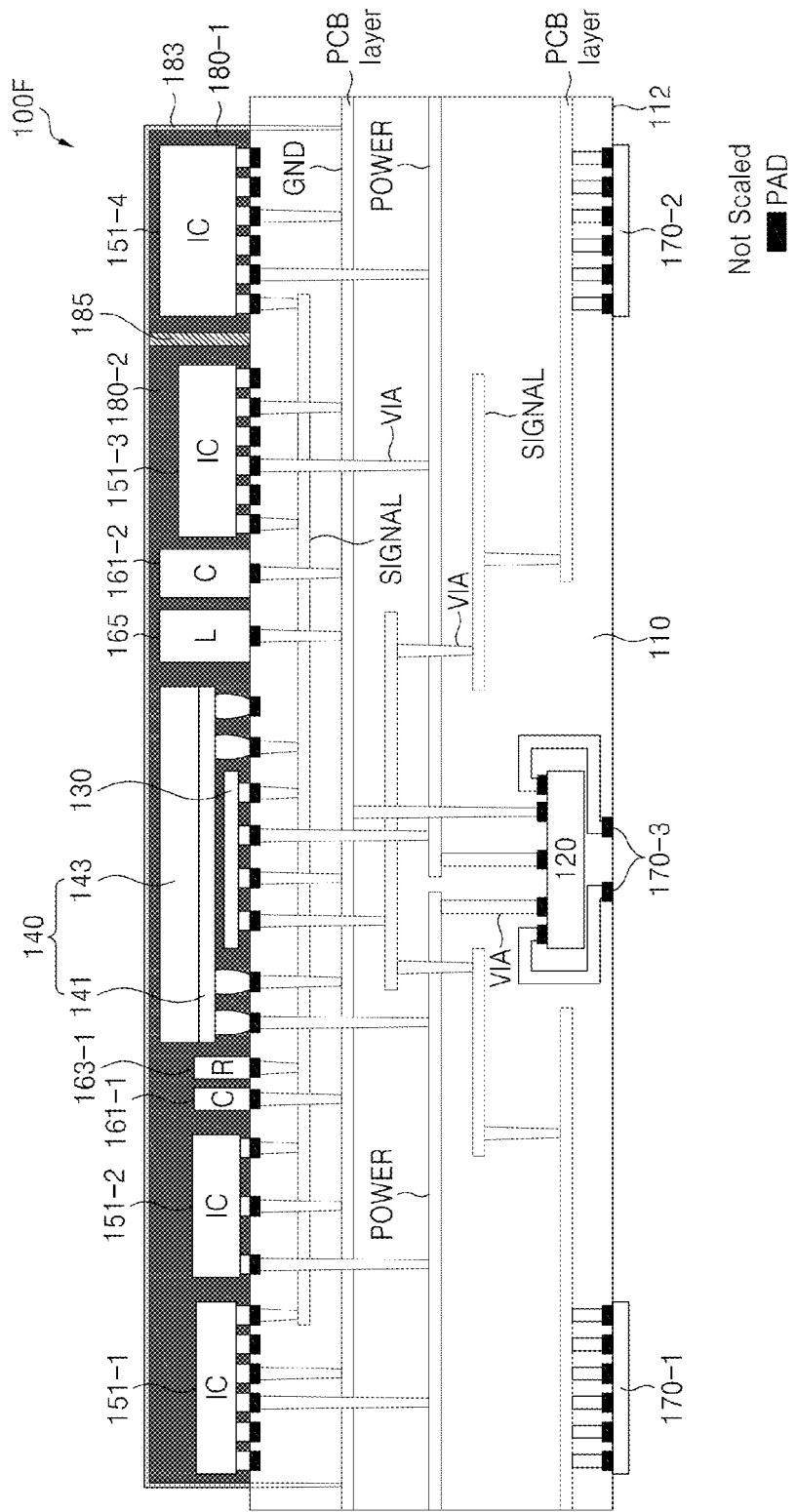

FIGS. 6 and 7 show cross-sectional views of system modules according to exemplary embodiments of the present inventive concept. According to an exemplary embodiment, the via 181 of FIG. 4 may be filled with a conductive material 185, as shown in FIGS. 6 and 7. Referring to FIGS. 6 and 7, the conductive EMI shielding material 183 may be formed on each of the first portion 180-1 of the protective material 180, the second portion 180-2 of the protective material 180, and the conductive material 185. The conductive EMI shielding material 183 and the conductive material 185 may be electrically connected. According to an exemplary embodiment, the conductive material 185 may be connected to the ground line GND of the first PCB 110.

Referring to FIGS. 4 to 7, the conductive material 185 filling the via 181 may perform a function of shielding EMI.

For example, in an exemplary embodiment, the component 151-4 (e.g., a fourth IC) may be embodied as a radio frequency (RF) IC (or any other IC capable of causing EMI), and the conductive material 185 filling the via 181 may perform a function of shielding EMI occurring in a substantially horizontal direction between at least one of the components 120, 130, 140, 143, 151-1, 151-2, 151-3, 161-1, 161-2, 163-1, and 165 attached to the first surface 111 and the component 151-4.

Figure 8:
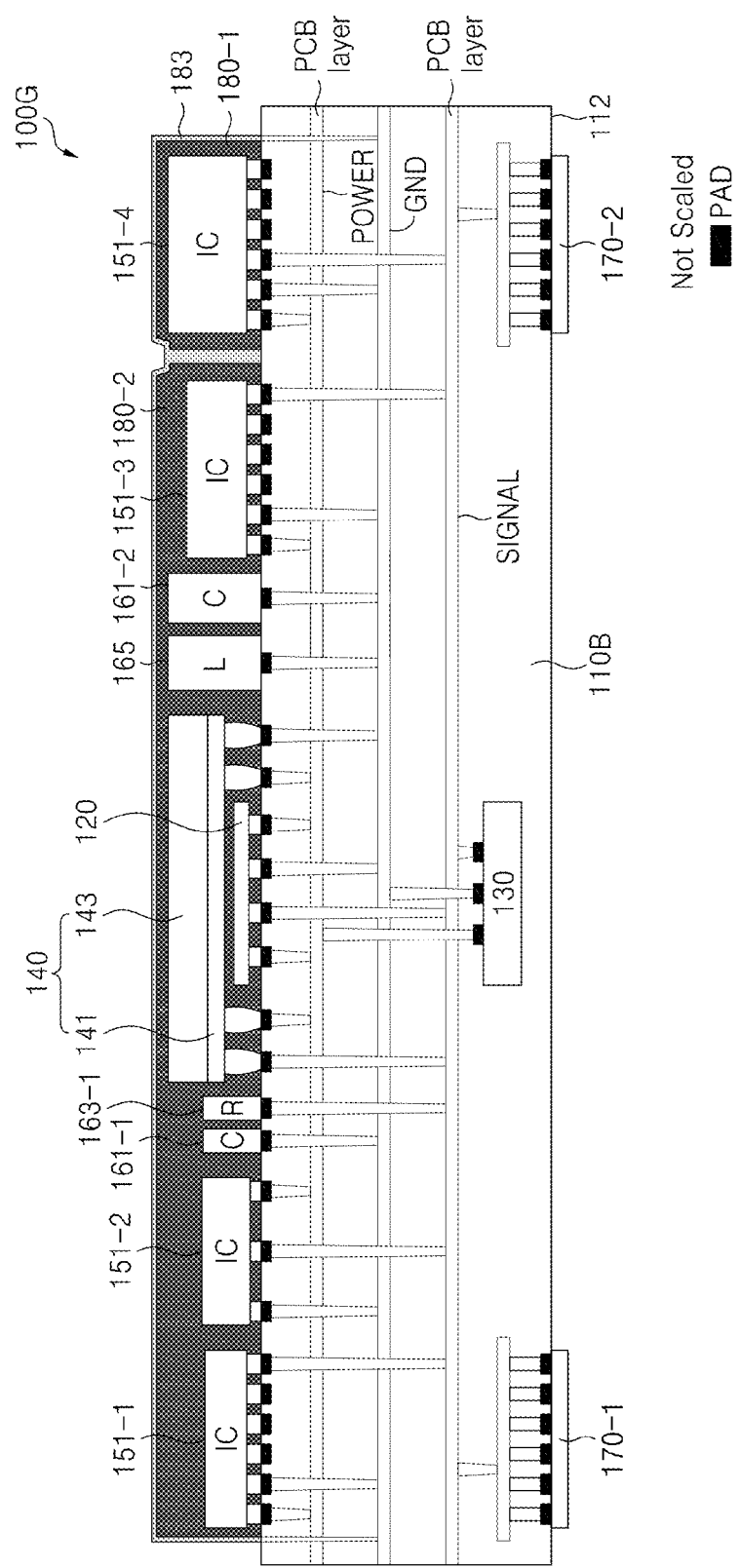
FIGS. 8 and 9 are cross-sectional views of system modules including a first PCB having an embedded second semiconductor chip according to exemplary embodiments of the present inventive concept.
Figure 9:
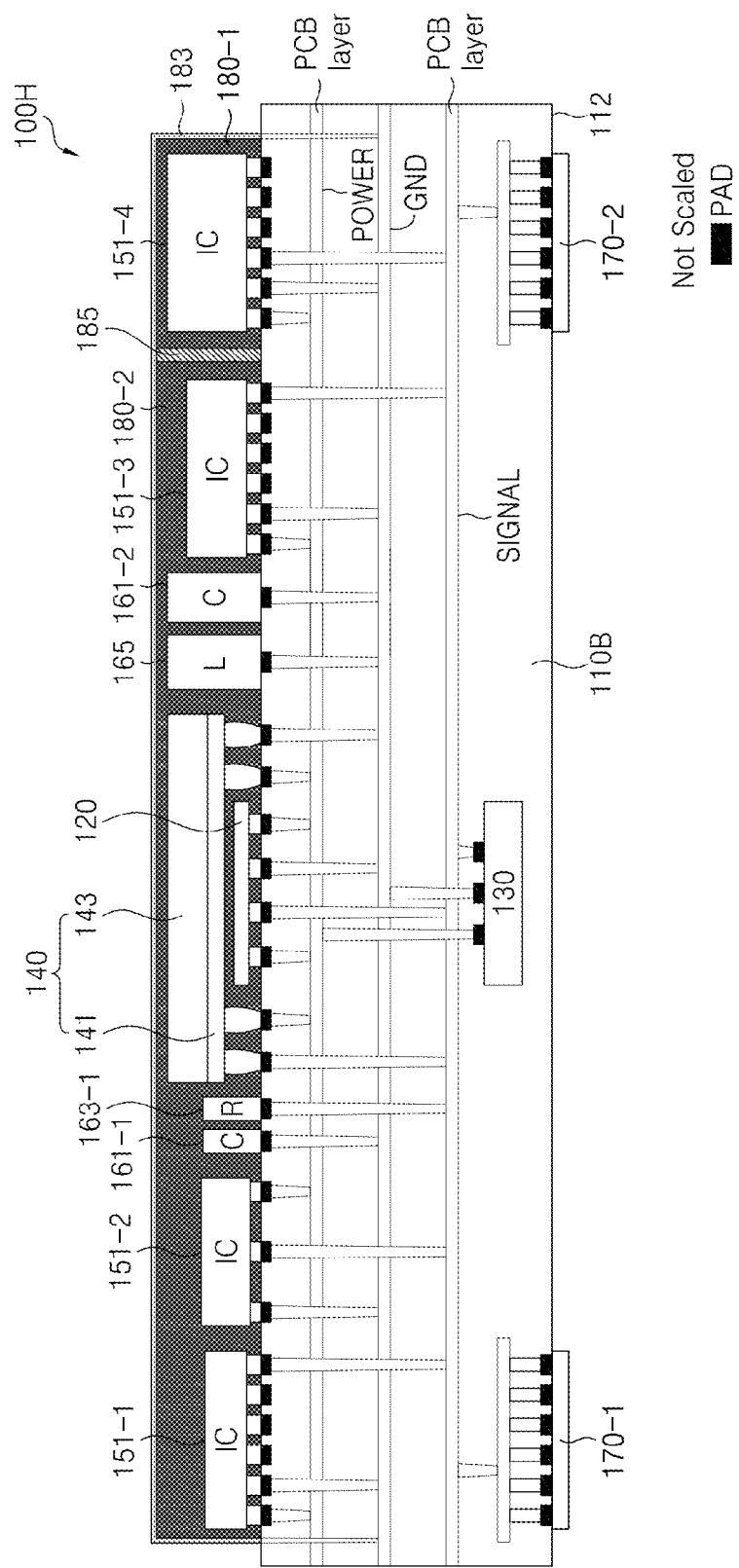

FIGS. 8 and 9 are cross-sectional views of system modules including a first PCB having an embedded second semiconductor chip according to exemplary embodiments of the present inventive concept.

Referring to FIG. 8, the system module 100G is conceptually the same as the system module 100D of FIG. 5, except that the processor chip 130 is embedded in the first PCB 110B instead of the PMIC 120, and except for the internal structure of the first PCB 110B. The PMIC 120 may be disposed/mounted at a position facing the processor chip 130 on the first surface 111 of the first PCB 110B.

The semiconductor package 140 may be disposed to be horizontally laid over the PMIC 120. For example, the semiconductor package 140 may be disposed above and overlap the PMIC 120. The semiconductor package 140 may be mounted on the first surface 111 of the first PCB 110B through metal balls. The PMIC 120 may be disposed between the metal balls connecting the semiconductor package 140 to the first PCB 110B.

The PMIC 120 disposed on the first surface 111 of the first PCB 110B may supply operation voltages to each of the components 130, 140, 151-1, 151-2, 151-3, and 151-4 through the vias VIA, the pads PAD, the ground line GND, and the voltage supply line POWER disposed in the first PCB 110B. Moreover, the PMIC 120 may supply a ground voltage and/or an operation voltage to at least one of the passive elements 161-1, 161-2, 163-1, and 165 through the vias VIA, the pads PAD, the ground line GND, and the voltage supply line POWER disposed in the first PCB 110B.

The processor chip 130 embedded in the first PCB 110B may control an operation of each of the components 120, 140, 151-1, 151-2, 151-3, and 151-4, or transmit or receive signals to or from each of the components 120, 140, 151-1, 151-2, 151-3, and 151-4 through a signal transmission line SIGNAL disposed in the first PCB 110B.

Referring to FIGS. 4-5 and 8, the conductive EMI shielding material 183 may be formed on each of the first portion 180-1 of the protective material 180, the second portion 180-2 of the protective material 180, and the via 181. The conductive EMI shielding material 183 may be connected to the ground line GND embedded in the first PCB 110B.

The via 181 of FIG. 4 may be filled with the conductive material 185. Referring to FIG. 9, the conductive EMI shielding material 183 may be formed on each of the first portion 180-1 of the protective material 180, the second portion 180-2 of the protective material 180, and the conductive material 185. The conductive EMI shielding material 183 may be electrically connected to the conductive material 185. According to an exemplary embodiment, the conductive material 185 may be connected to the ground line GND of the first PCB 110B.

FIGS. 10 to 13 are cross-sectional views of system modules including the first PCB having an embedded second semiconductor chip according to an exemplary embodiment of the present inventive concept. The processor chip 130 is embedded within a first PCB 110C of each of system modules 100I, 100J, 100K, and 100L. The semiconductor package 140 connected to the processor chip 130 may be disposed over the first surface of the first PCB 110C so as to face or spatially overlap the processor chip 130. For example, the semiconductor package 140 may be disposed in a POP form with the first PCB 110C. The PMIC 120 is not disposed between the first PCB 110C and the semiconductor package 140.

Figure 10:
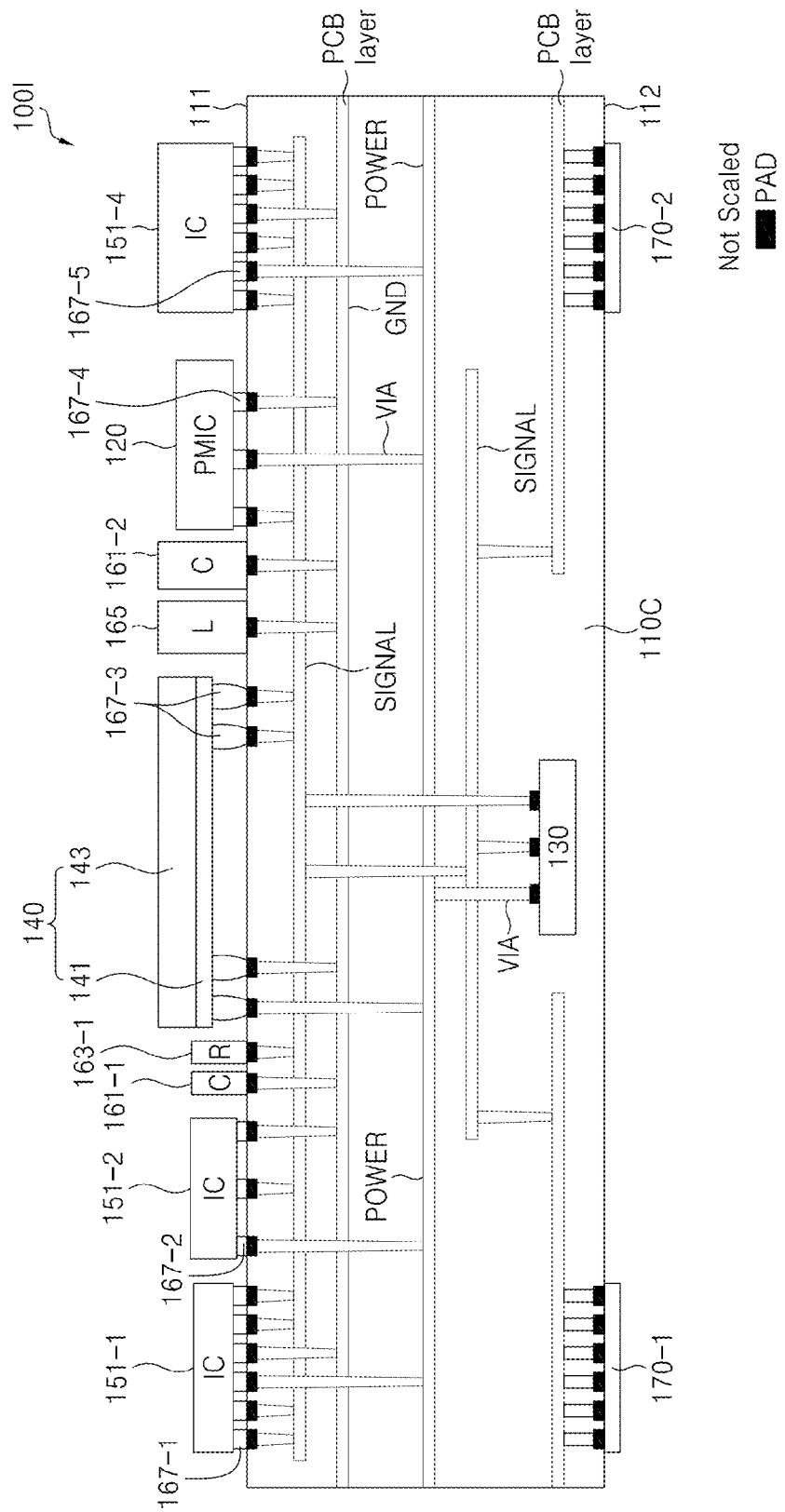
FIGS. 10 to 13 are cross-sectional views of system modules including the first PCB having an embedded second semiconductor chip according to an exemplary embodiment of the present inventive concept.

Referring to FIGS. 1 and 10, the PMIC 120 is disposed on the first surface 111 of the first PCB 110C instead of the third IC 151-3. The PMIC 120 is connected to the first surface 111 of the first PCB 110C through metal balls 167-4.

The PMIC 120 disposed on the first surface 111 of the first PCB 110C may supply corresponding operation voltages (e.g., an operation voltage and a ground voltage) to each of the components 130, 140, 151-1, 151-2, and 151-4 through vias VIA, pads PAD, a ground line GND, and a voltage supply line POWER disposed in the first PCB 110C. Moreover, the PMIC 120 may supply a ground voltage and/or an operation voltage to at least one of the passive elements 161-1, 161-2, 163-1, and 165 through the vias VIA, the pads PAD, the ground line GND, and the voltage supply line POWER disposed in the first PCB 110C.

The processor chip 130 embedded in the first PCB 110C may control an operation of each of the components 120, 140, 151-1, 151-2, and 151-4, or transmit or receive signals to or from each of the components 120, 140, 151-1, 151-2, and 151-4 through the vias VIA, the pads PAD, and the signal transmission line SIGNAL disposed in the first PCB 110C. Each of the components 120, 130, 140, 151-1, 151-2, and 151-4 may transmit or receive signals to or from each other through the vias VIA, the pads PAD, and the signal transmission line SIGNAL disposed in the first PCB 110C.

As described above with reference to FIG. 1, at least one of the pads connected to the metal balls 167-1, 167-2, 167-3, 167-4, or 167-5 may also be used as a connection pad during a connection operation, in addition to a test pad during a testing operation. That is, some of the pads connected to the processor chip 130 may be used as test pads, and may be also used as SMD pads for directly mounting SMDs 120, 140, 151-1, 151-2, 151-4, 161-1, 161-2, 163-1, and 165 on the first PCB 110C.

Figure 11:
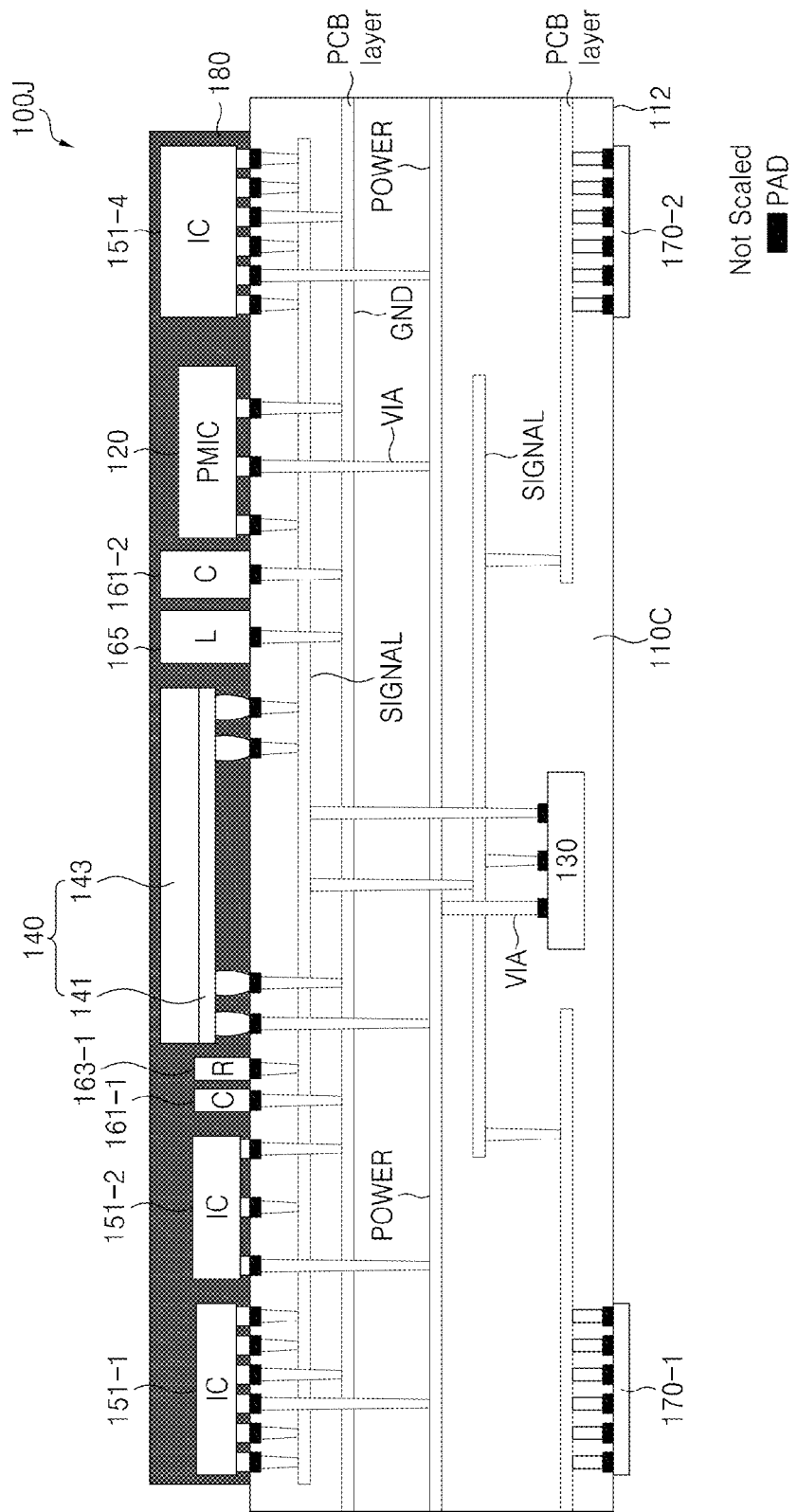

Referring to FIGS. 3, 10, and 11, the system module 100I of FIG. 10 is conceptually the same as the system module 100J shown in FIG. 11, except that the protective material 180 is formed on the first surface 111 of the first PCB 110C in FIG. 11. Referring to FIGS. 10 and 11, in an exemplary embodiment, the components 120, 141, 143, 151-1, 151-2, 151-4, 161-1, 161-2, 163-1, and 165 attached to the first surface 111 of the first PCB 110C, the metal balls 167-1, 167-2, 167-3, 167-4, and 167-5, and pads disposed on the first surface 111 are encapsulated by the protective material 180. The protective material 180 may be, for example, an EMC. However, the protective material 180 is not limited thereto.

Figure 12:
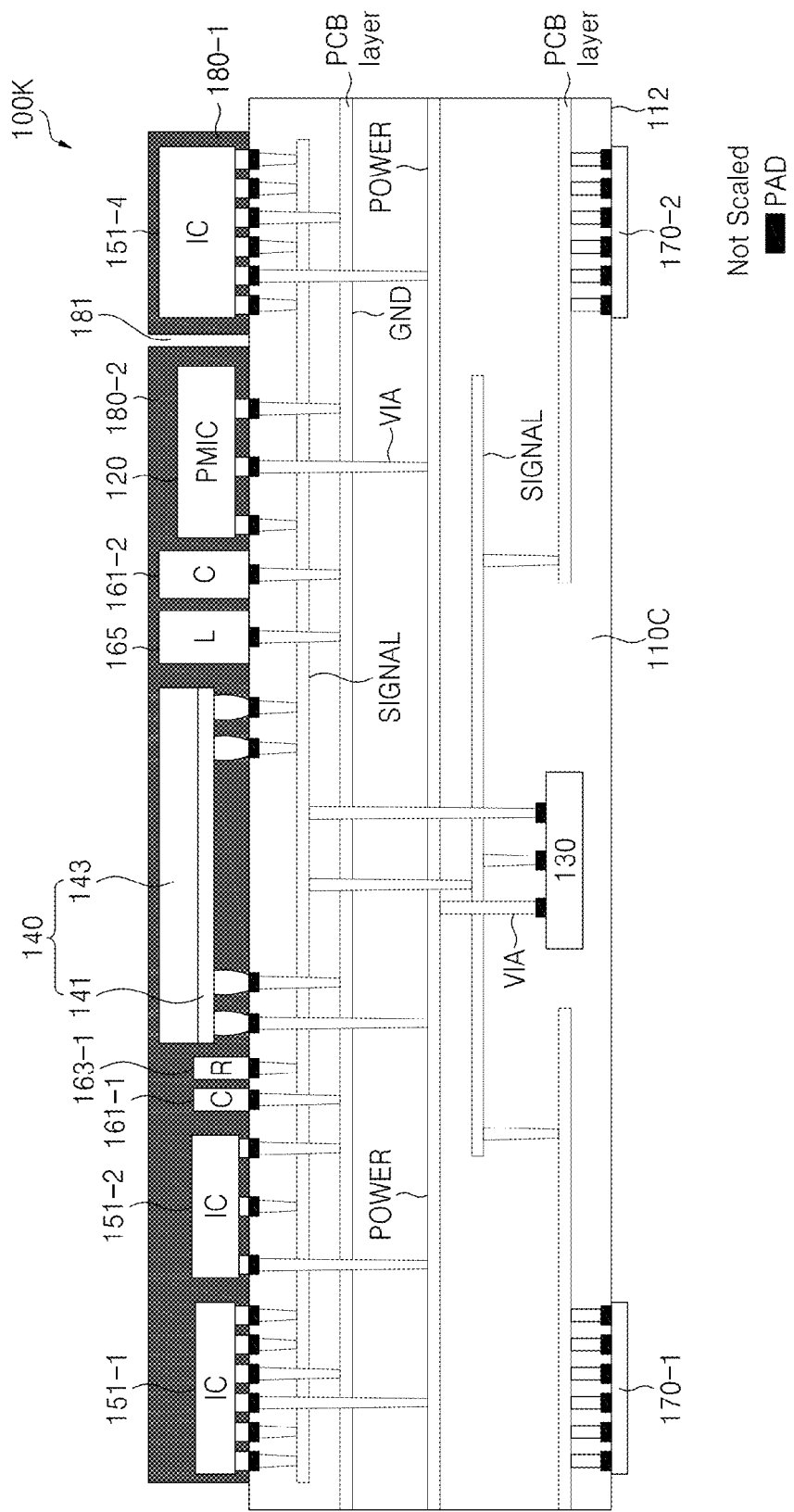

Referring to FIGS. 11 and 12, the system module 100J of FIG. 11 is conceptually the same as the system module 100K shown in FIG. 12, except that the via 181 is formed in the protective material 180 in the embodiment of FIG. 12. As described above, the via 181 may be a laser-drilled via. The protective material 180 in the embodiment of FIG. 11 may be divided into the first portion 180-1 of the protective material 180 and the second portion 180-2 of the protective material 180 by the via 181, as shown in FIG. 12. As described above, the via 181 may be formed by a laser drill.

Figure 13:
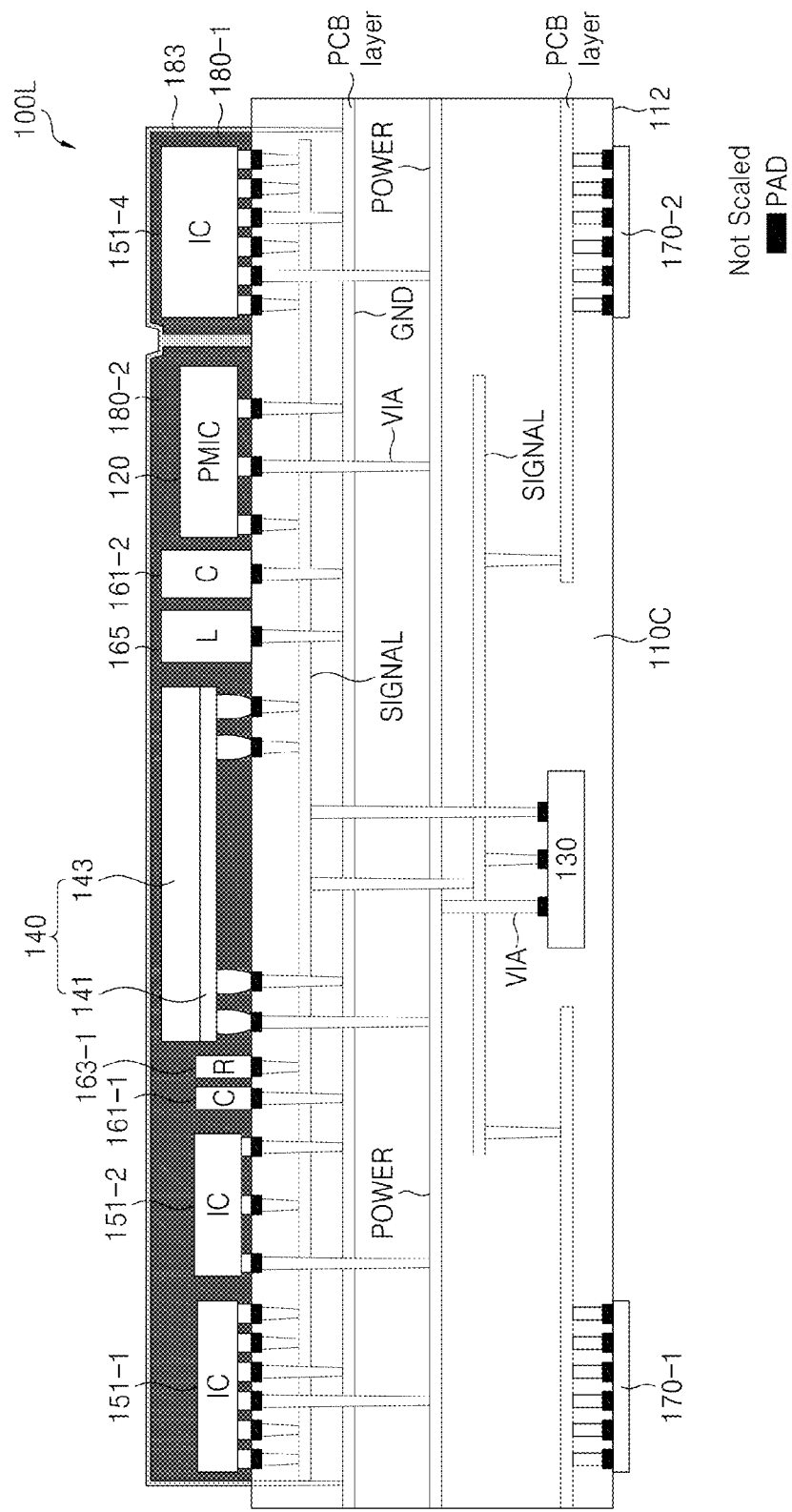

Referring to FIGS. 12 and 13, the conductive EMI shielding material 183 may be formed on each of the first portion 180-1 of the protective material 180, the second portion 180-2 of the protective material 180, and the via 181. The conductive EMI shielding material 183 may fill (e.g., completely fill) the via 181. The conductive EMI shielding material 183 may be connected to the ground line GND embedded in the first PCB 110C.

Referring to FIG. 13, the conductive EMI shielding material 183 filling the via 181 may perform a function of shielding EMI. For example, in an exemplary embodiment, the component 151-4 (e.g., a fourth IC) may be embodied as a radio frequency (RF) IC (or any other IC capable of causing EMI), and the EMI shielding material 183 filling the via 181 may perform a function of shielding EMI occurring in a substantially horizontal direction between at least one of the components 120, 140, 151-1, 151-2, 161-1, 161-2, 163-1, and 165 attached to the first surface 111 and the component 151-4.

Figure 14:
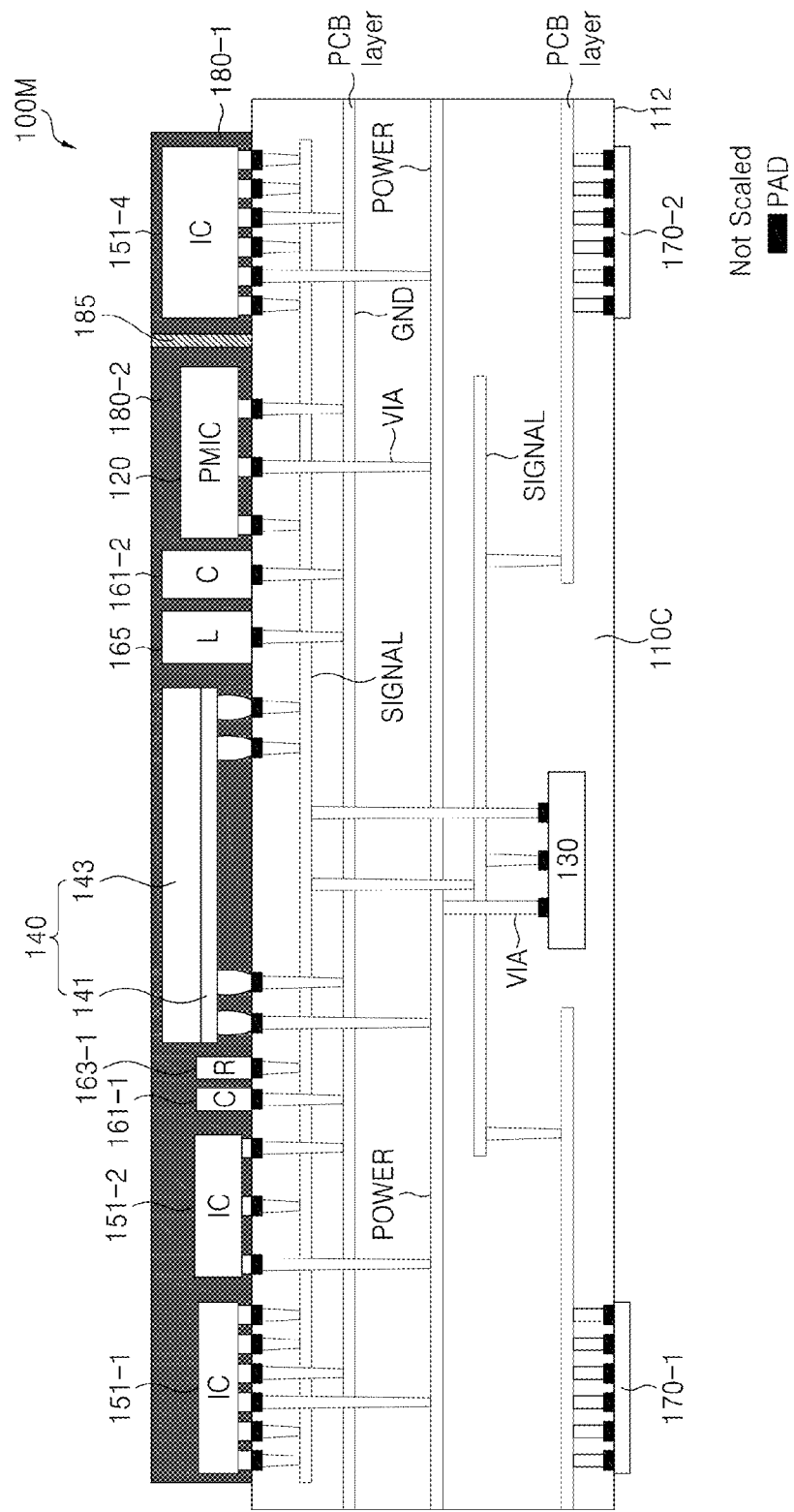
FIGS. 14 and 15 are cross-sectional views of system modules including the first PCB having an embedded second semiconductor chip according to an exemplary embodiment of the present inventive concept.
Figure 15:
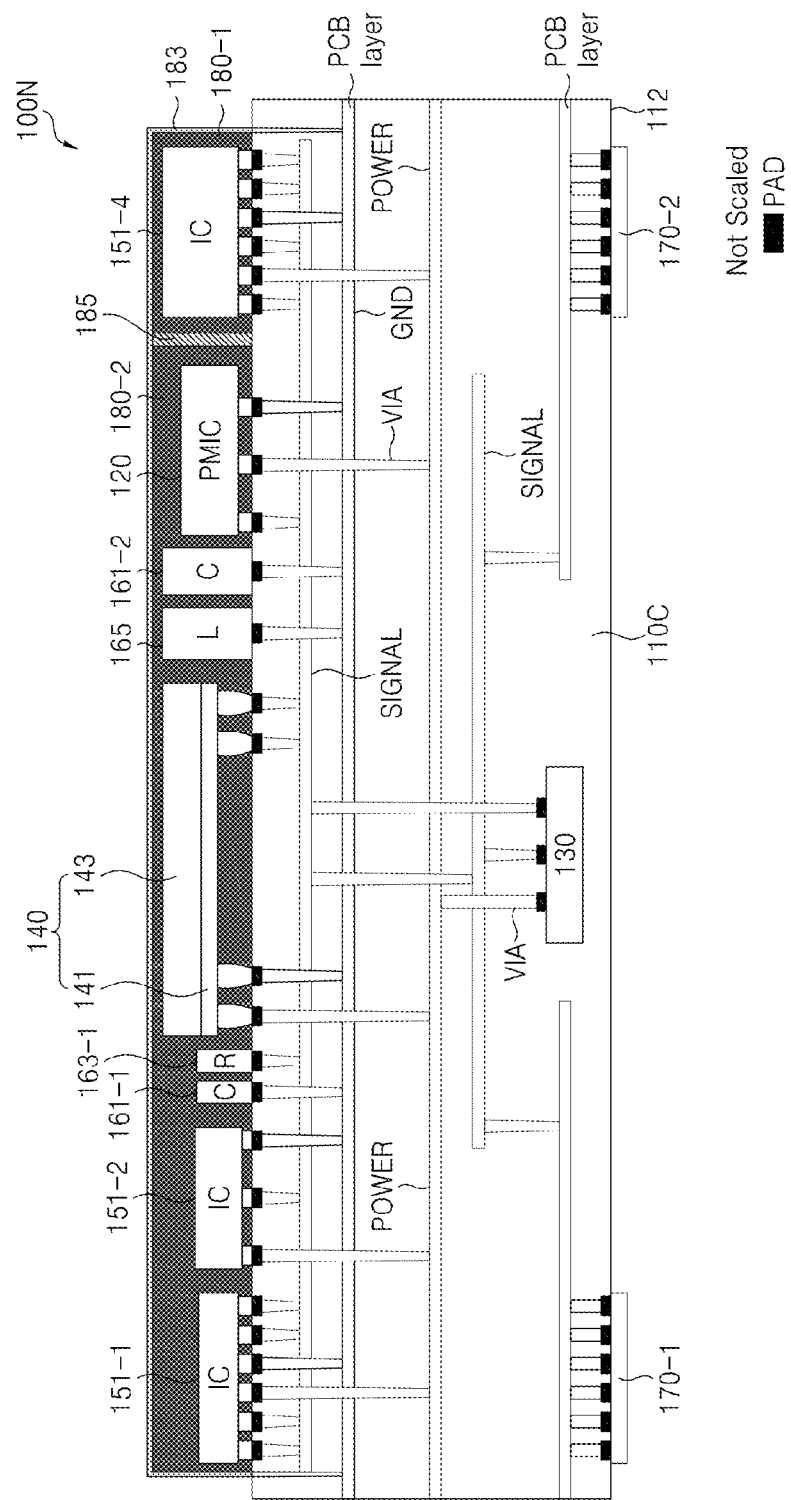

FIGS. 14 and 15 are cross-sectional views of system modules including the first PCB having an embedded second semiconductor chip according to an exemplary embodiment of the present inventive concept.

In an exemplary embodiment, the via 181 shown in FIG. 4 may be filled with the conductive material 185 shown in FIG. 14. Referring to FIGS. 14 and 15, the conductive EMI shielding material 183 may be formed on each of the first portion 180-1 of the protective material 180, the second portion 180-2 of the protective material 180, and the conductive material 185. The conductive EMI shielding material 183 and the conductive material 185 may be electrically connected to each other. According to an exemplary embodiment, the conductive material 185 may be connected to the ground line GND of the first PCB 110C.

Referring to FIGS. 13 and 15, the conductive material 185 filling the via 181 may perform a function of shielding EMI. For example, in an exemplary embodiment, the component 151-4 (e.g., a fourth IC) may be embodied as a radio frequency (RF) IC (or any other IC capable of causing EMI), and the conductive material 185 filling the via 181 may perform a function of shielding EMI occurring in a substantially horizontal direction between at least one of the components 120, 141, 143, 151-1, 151-2, 161-1, 161-2, 163-1, and 165 attached to the first surface 111 and the component 151-4.

Figure 16:
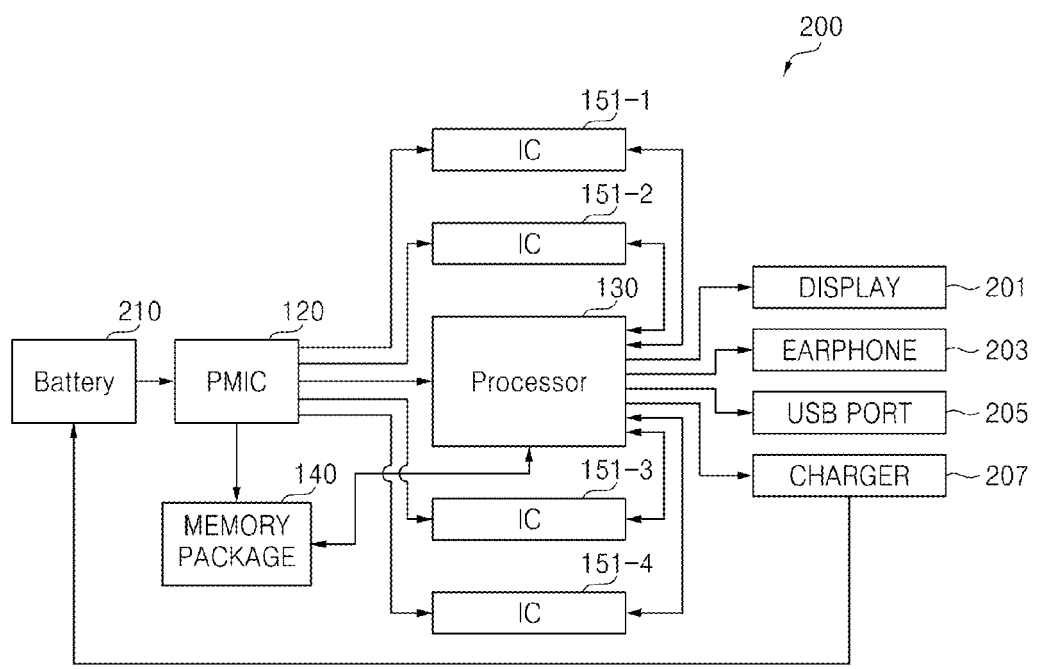
FIG. 16 is a block diagram of a mobile computing device including the system module according to an exemplary embodiment of the present inventive concept.

FIG. 16 is a block diagram of a mobile computing device including a system module according to an exemplary embodiment of the present inventive concept. A mobile computing device 200 may be embodied as, for example, a mobile phone, a smartphone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an Internet of Things (IoT) device, an Internet of Everything (IoE) device, a drone, etc. However, the mobile computing device 200 is not limited thereto.

The mobile computing device 200 may include the PMIC 120, the processor chip 130, the semiconductor package (or memory package) 140, the plurality of ICs 151-1 to 151-4, peripheral devices 201, 203, 205, and 207, and a battery 210. The peripheral devices 201, 203, 205, and 207 may include, for example, a display, an earphone(s), a USB port, and a charger.

The battery 210 may supply a voltage to the PMIC 120. The battery 210 may be embodied as a rechargeable battery and/or as a flexible battery. However, the battery 210 is not limited thereto. The PMIC 120 may supply an operation voltage and a ground voltage to each of the components 130, 140, 151-1, 151-2, 151-3, and 151-4 using the voltage supplied from the battery 210. As described above with reference to FIGS. 1 to 15, the first PCB 110, 110B, or 110C may include the ground line GND, the voltage supply line POWER, and the vias VIA.

The processor chip 130 may control an operation of each of the components 120, 140, 151-1, 151-2, 151-3, 151-4, 201, 203, 205, and 207.

Figure 17:
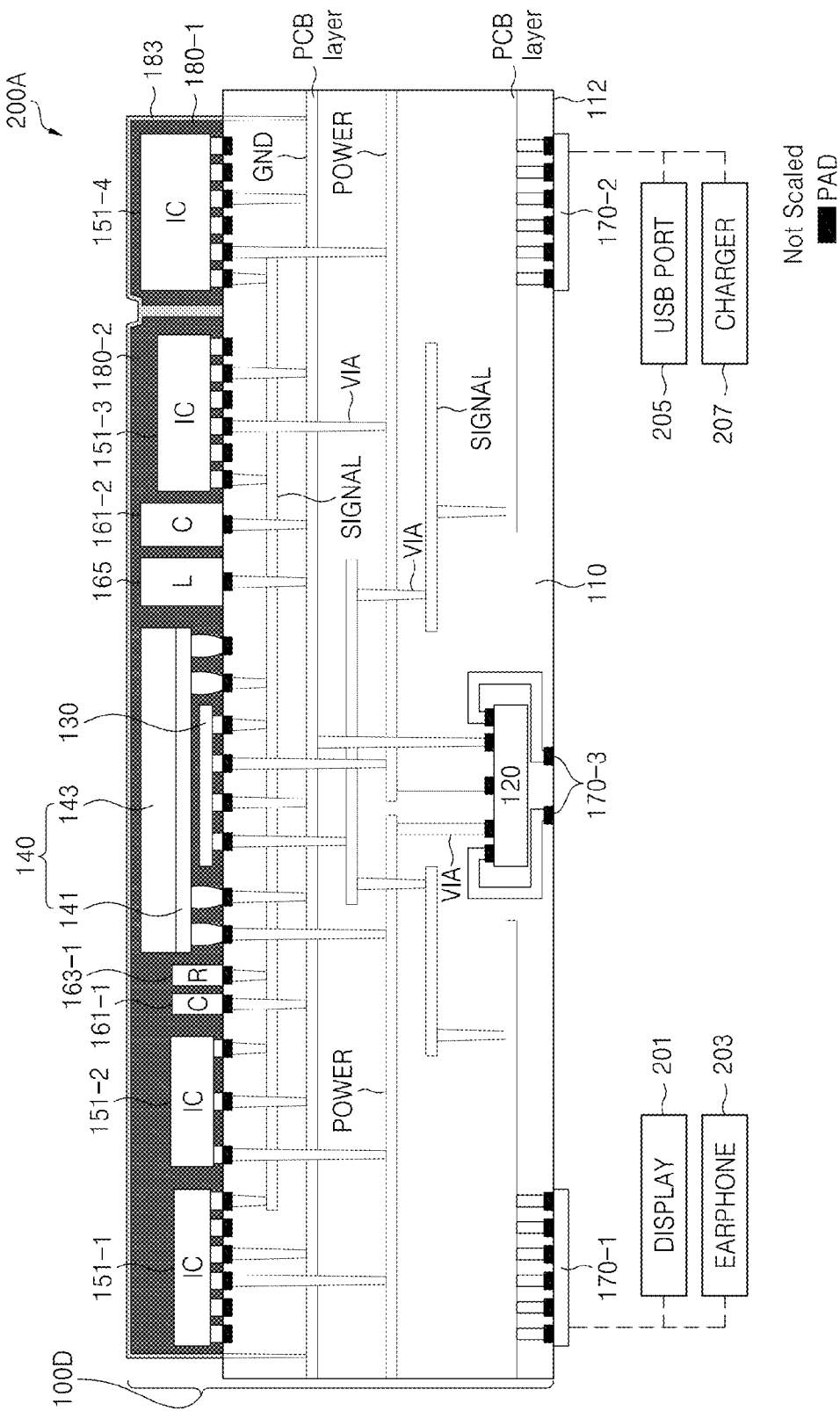
FIG. 17 is a block diagram of the mobile computing device of FIG. 16 including the system module shown in FIG. 5 according to an exemplary embodiment of the present inventive concept.

FIG. 17 is a block diagram of the mobile computing device of FIG. 16 including the system module shown in FIG. 5 according to an exemplary embodiment of the present inventive concept. Referring to FIGS. 5, 16, and 17, in a mobile computing device 200A according to an exemplary embodiment of the mobile computing device 200, the PMIC 120 may be embedded in the first PCB 110 and the processor chip 130 may be disposed between the first PCB 110 and the semiconductor package 140. The display 201 or the earphone(s) 203 may be connected to the first connectors 170-1, and the USB port 205 or the charger 207 may be connected to the second connectors 170-2.

Figure 18:
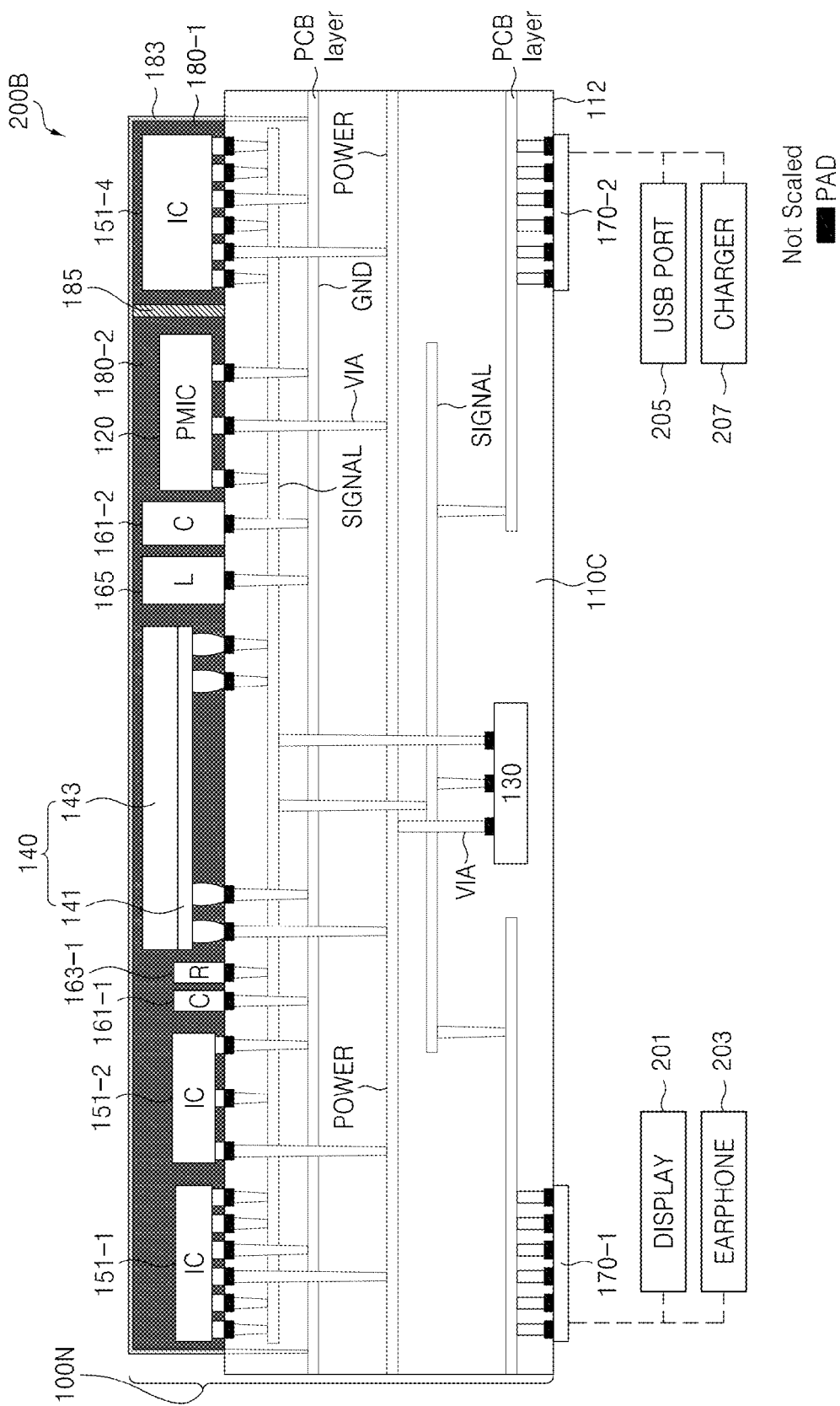
FIG. 18 is a block diagram of the mobile computing device of FIG. 16 including the system module shown in FIG. 15 according to an exemplary embodiment of the present inventive concept.

FIG. 18 is a block diagram of the mobile computing device of FIG. 16 including the system module shown in FIG. 15 according to an exemplary embodiment of the present inventive concept. Referring to FIGS. 15, 16, and 18, in a mobile computing device 200B according to an exemplary embodiment of the mobile computing device 200, the processor chip 130 may be embedded in the first PCB 110 and the PMIC 120 may not be disposed between the first PCB 110 and the semiconductor package 140. Rather, the PMIC 120 is disposed on the first surface 111 of the first PCB 110C. The display 201 or the earphone(s) 203 may be connected to the first connectors 170-1, and the USB port 205 or the charger 207 may be connected to the second connectors 170-2.

In a system module according to exemplary embodiments of the present inventive concept, one of a processor chip and a power management IC is embedded within a system board/PCB. As a result, the thickness and size of the system module may be decreased, and power and signal integrity of the system module may be improved.

The system module according to exemplary embodiments of the present inventive concept includes one of the processor chip and the power management IC embedded within the system board/PCB, thereby improving power efficiency, power integrity, and signal integrity of electronic components mounted/disposed on the system module, while reducing the size and the thickness of the system module.

While the present inventive concept has been shown and described with reference to the exemplary embodiments thereof, it will be appreciated by those skilled in the art that various changes in form and detail may be made therein without departing from the spirit and scope of the present inventive concept as defined by the following claims.

What is claimed is:

1. A system module, comprising:
   a printed circuit board (PCB);
   a first semiconductor chip completely embedded in the PCB, wherein an upper surface of the PCB completely covers an upper surface of the first semiconductor chip, and a lower surface of the PCB completely covers a lower surface of the first semiconductor chip;
   a semiconductor package connected to the upper surface of the PCB through a plurality of stack balls; and
   a second semiconductor chip disposed on the upper surface of the PCB in a space between the PCB and the semiconductor package.

2. The system module of claim 1, wherein the first semiconductor chip is one of a power management integrated circuit (PMIC) and a processor chip, and the second semiconductor chip is the other one of the PMIC and the processor chip.

3. The system module of claim 2, further comprising:
   a plurality of first pads disposed on the upper surface of the PCB and connected to the first semiconductor chip,
   wherein at least two of the first pads are test pads for transmitting a plurality of test signals to the first semiconductor chip during a testing operation of the first semiconductor chip.

4. The system module of claim 3, further comprising:
   a third semiconductor chip connected to some of the first pads,
   wherein the some of the first pads are connection pads connecting the third semiconductor chip to the upper surface of the PCB.

5. The system module of claim 4, further comprising:
   a plurality of second pads disposed on the lower surface of the PCB,
   wherein the second pads comprise at least one second pad connected to the first semiconductor chip, and at least one second pad connecting the PCB to a peripheral device, at least one second pad for performing a debugging operation, or at least one second pad that is a general-purpose input/output (GPIO) pad.

6. The system module of claim 1, further comprising:
   a first integrated circuit (IC) and a second IC attached to the upper surface of the PCB;
   a plurality of passive elements attached to the upper surface of the PCB; and
   a protective material encapsulating the first IC, the second IC, the passive elements, and the semiconductor package.

7. The system module of claim 6, further comprising:
   a conductive electromagnetic interference (EMI) shielding material formed on the protective material and connected to a ground line embedded in the PCB.

8. The system module of claim 7,
   wherein the protective material is separated into a first portion and a second portion by the conductive EMI shielding material,
   wherein the first IC is disposed in the first portion, and the second IC, the passive elements, and the semiconductor package are disposed in the second portion,
   wherein EMI is shielded between the first and second portions by the conductive EMI shielding material.

9. The system module of claim 6,
   wherein the protective material is separated into a first portion and a second portion by a metal material,
   wherein the first IC is disposed in the first portion, and second IC, the passive elements, and the semiconductor package are disposed in the second portion,
   wherein EMI is shielded between the first and second portions by the metal material.

10. The system module of claim 1, wherein the semiconductor package comprises:
    a volatile memory chip;
    a non-volatile memory chip; and
    a controller that controls an operation of the non-volatile memory chip,
    wherein the controller supports an embedded multimedia card (eMMC) protocol or a universal flash storage (UFS) protocol.

11. A system module, comprising:
    a printed circuit board (PCB);
    a processor chip completely embedded in the PCB, wherein an upper surface of the PCB completely covers an upper surface of the processor chip, and a lower surface of the PCB completely covers a lower surface of the processor chip; and a semiconductor package connected to the PCB through a plurality of stack balls and disposed at a position facing the processor chip.

12. The system module of claim 11, wherein the semiconductor package comprises:

a volatile memory chip;

a non-volatile memory chip; and a controller that controls an operation of the non-volatile memory chip, wherein the controller supports an embedded multimedia card (eMMC) protocol or a universal flash storage (UFS) protocol.

13. The system module of claim 12, further comprising:

a plurality of first pads disposed on the upper surface of the PCB and connected to the processor chip; and an integrated circuit (IC) mounted on the upper surface of the PCB, wherein at least two of the first pads are test pads for transmitting a plurality of test signals to the processor chip during a testing operation of the processors chip, and some of the first pads are connection pads connecting the IC to the upper surface of the PCB.

14. The system module of claim 11, further comprising:

a first integrated circuit (IC) and a second IC attached to the upper surface of the PCB;

a plurality of passive elements attached to the upper surface of the PCB;

a protective material encapsulating the first IC, the second IC, the passive elements, and the semiconductor package; and a conductive electromagnetic interference (EMI) shielding material formed on a surface of the protective material and connected to a ground line embedded in the PCB.

15. The system module of claim 14, wherein the protective material is separated into a first portion and a second portion by the conductive EMI shielding material, wherein the first IC is disposed in the first portion, and the second IC, the passive elements, and the semiconductor package are disposed in the second portion, wherein EMI is shielded between the first and second portions by the conductive EMI shielding material.

16. The system module of claim 14, wherein the protective material is separated into a first portion and a second portion by a metal material, wherein the first IC is disposed in the first portion, and the second IC, the passive elements, and the semiconductor package are disposed in the second portion, wherein EMI is shielded between the first and second portions by the metal material.

17. A mobile computing device, comprising:

a system module;

a peripheral device connected to the system module; and a battery connected to the system module, wherein the system module comprises:

a printed circuit board (PCB);

a first semiconductor chip completely embedded in the PCB, wherein an upper surface of the PCB completely covers an upper surface of the first semiconductor chip, and a lower surface of the PCB completely covers a lower surface of the first semiconductor chip;

a semiconductor package connected to the upper surface of the PCB through a plurality of stack balls; and a second semiconductor chip disposed on the upper surface of the PCB in a space between the PCB and the semiconductor package, wherein the first semiconductor chip is one of a power management integrated circuit (PMIC) and a processor chip, and the second semiconductor chip is the other one of the PMIC and the processor chip.

18. The mobile computing device of claim 17, wherein the system module further comprises:

a plurality of first pads disposed on the upper surface of the PCB and connected to the first semiconductor chip; and an integrated circuit (IC) mounted on the upper surface of the PCB, wherein at least two of the first pads are test pads for transmitting a plurality of test signals to the first semiconductor chip during a testing operation of the first semiconductor chip, and some of the first pads are connection pads connecting the IC to the upper surface of the PCB.

19. The mobile computing device of claim 18, wherein the system module further comprises:

a plurality of second pads disposed on the lower surface of the PCB, wherein at least one of the second pads is connected to the first semiconductor chip, some of the second pads are connected to the peripheral device, and the second pads are flexible film connectors or flexible printed circuit (FPC) connectors.

20. The mobile computing device of claim 17, further comprising:

a first integrated circuit (IC) and a second IC attached to the upper surface of the PCB;

a plurality of passive elements attached to the upper surface of the PCB;

a protective material encapsulating the first IC, the second IC, the passive elements, the second semiconductor chip, and the semiconductor package; and a conductive electromagnetic interference (EMI) shielding material formed on a surface of the protective material and connected to a ground line embedded in the PCB.

* * * * *